United States Patent
Tu et al.

(10) Patent No.: US 8,442,470 B1
(45) Date of Patent: May 14, 2013

(54) HARMONIC-REJECT FTI FILTER

(75) Inventors: Cao-Thong Tu, Preverenges (CH);
David Cousinard, Morges (CH);
Frederic Declercq, Cossonay (CH)

(73) Assignee: Marvell International Ltd., Hamilton (BM)

( * ) Notice: Subject to any disclaimer, the term of this patent is extended or adjusted under 35 U.S.C. 154(b) by 264 days.

(21) Appl. No.: 12/778,236

(22) Filed: May 12, 2010

Related U.S. Application Data

(60) Provisional application No. 61/178,455, filed on May 14, 2009.

(51) Int. Cl.
*H04B 15/00* (2006.01)

(52) U.S. Cl.
USPC ....... 455/283; 455/76; 455/114.1; 455/165.1; 455/183.1; 455/189.1; 455/209; 455/293; 455/326

(58) Field of Classification Search ............... 455/114.1, 455/189.1, 209, 293, 326, 76, 165.1, 183.1
See application file for complete search history.

(56) References Cited

U.S. PATENT DOCUMENTS

| | | | | |
|---|---|---|---|---|
| 5,960,183 | A * | 9/1999 | Toumazou et al. | 716/100 |
| 6,493,400 | B1 * | 12/2002 | Greeley et al. | 375/297 |
| 2003/0078028 | A1 | 4/2003 | Shimada et al. | |
| 2005/0195014 | A1 * | 9/2005 | Katakura | 327/355 |
| 2006/0128340 | A1 * | 6/2006 | Hsieh et al. | 455/302 |
| 2009/0191833 | A1 * | 7/2009 | Kaczman et al. | 455/296 |

FOREIGN PATENT DOCUMENTS

WO WO 01/26215 4/2001

OTHER PUBLICATIONS

What is Q?; www.k.ext.ti.com/SRVS/Data/ti/KnowledgeBases/analog/document/faqs/q.htm; Feb. 6, 2007; 2 pages.
Application Note 1838 Mixer 2×2 Spurious Response and IP2 Relationship; Dallas Semiconductor MAXIM; www.maxim-ic.com/appnotes.cfm/appnote_number/1838; Feb. 5, 2007; 5 pages.
Understanding Surface Acoustic Wave (SAW) Devices for Mobile and Wireless Applications and Design Techniques; Section 18: "An Overview of SAW Devices for Mobile/Wireless Communications"; (68 Questions and Answers for Year 2007); (Including Real-Time SAW Fourier Transformers); Colin K. Campbell, Ph.D., D.Sc.; www3.sympatico.ca/colin.kydd.campbell/; Feb. 2, 2007; 37 pages.
The International Search Report and the Written Opinion of the International Searching Authority, or the Declaration dated Jun. 27, 2008 for International Application No. PCT/US2008/000903 filed Jan. 24, 2008; 11 pages.

\* cited by examiner

*Primary Examiner* — Edward Urban
*Assistant Examiner* — Rui Hu

(57) ABSTRACT

A system includes a weighting module, a mixer module, and a frequency selective impedance (FSI). The weighting module is configured to receive an input signal having an amplitude and to generate weighted outputs. Amplitudes of the weighted outputs have ratios relative to the amplitude of the input signal. The mixer module has switches configured to receive the weighted outputs and to generate a staircase waveform when the switches are clocked by clock signals. Amplitudes of steps of the staircase waveform are based on the ratios. The FSI is configured to communicate with the switches. The switches are configured to translate an impedance of the FSI centered on a first frequency to a second frequency determined by a frequency of the clock signals.

20 Claims, 26 Drawing Sheets

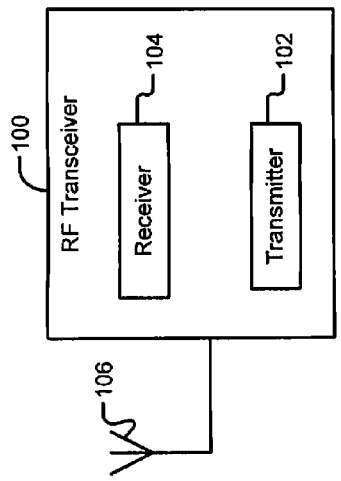
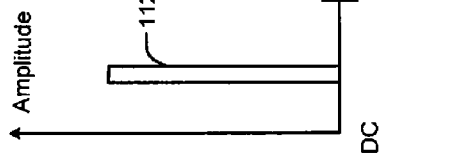
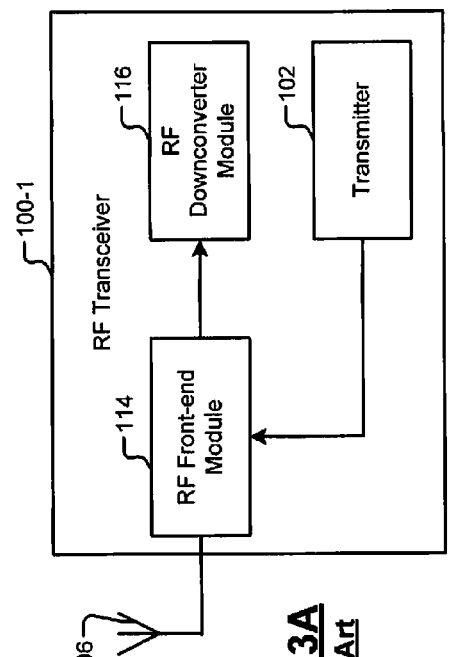
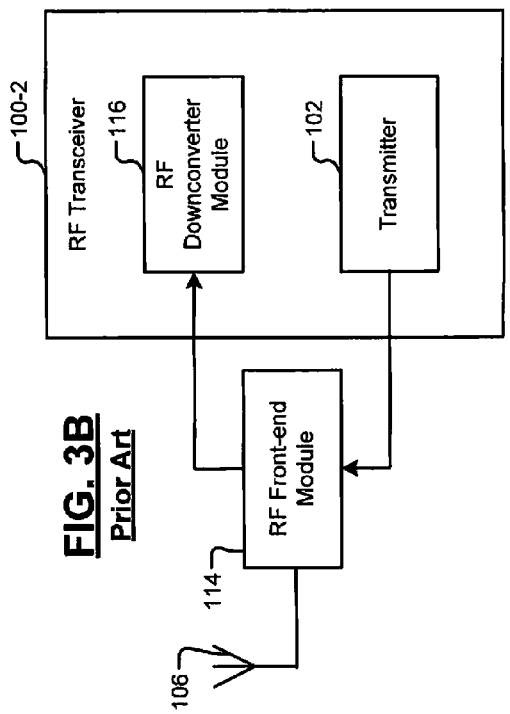

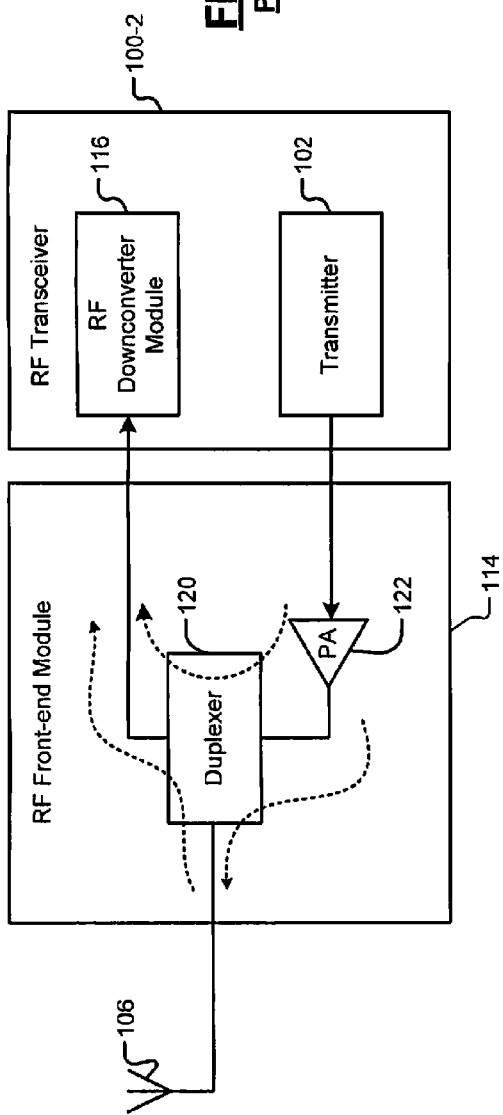
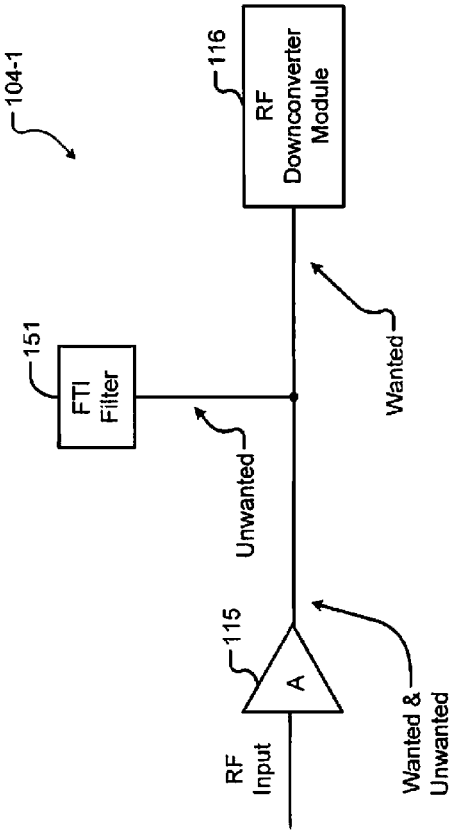
FIG. 3C
Prior Art
FIG. 4A

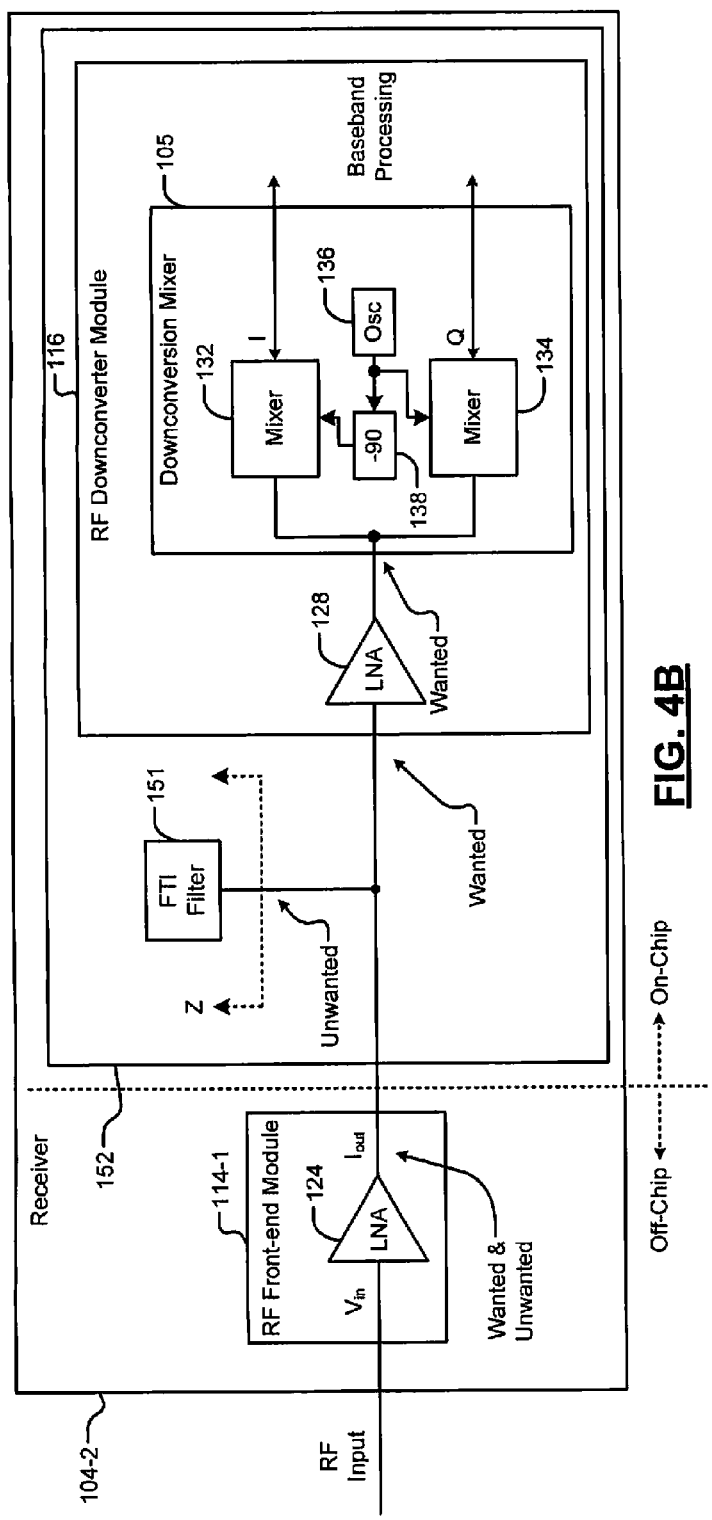
FIG. 4B
FIG. 4C
FIG. 4D

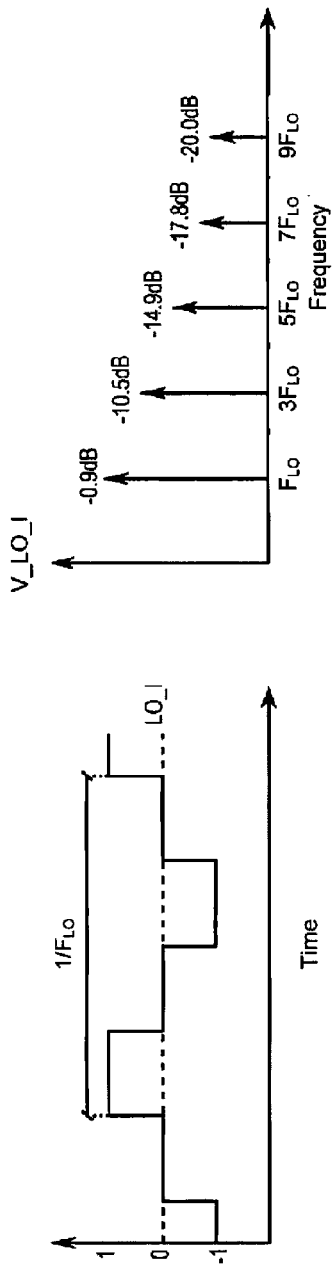
FIG. 9A
FIG. 9B
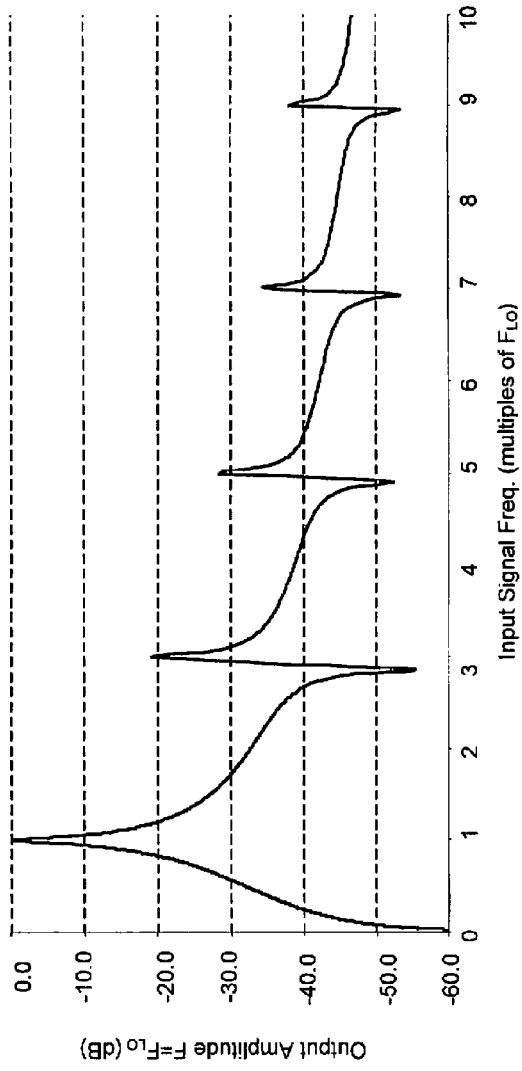
FIG. 10

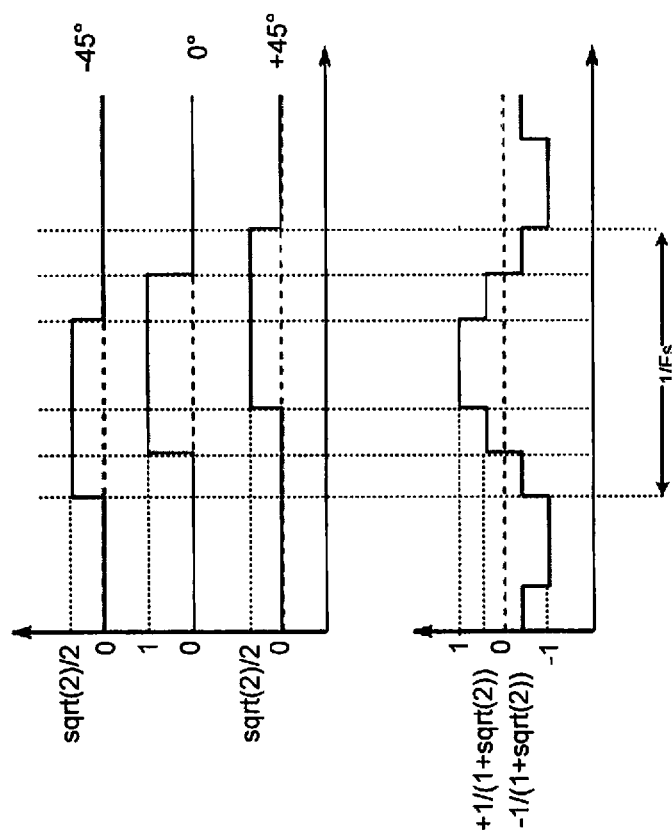
FIG. 12A
FIG. 12C
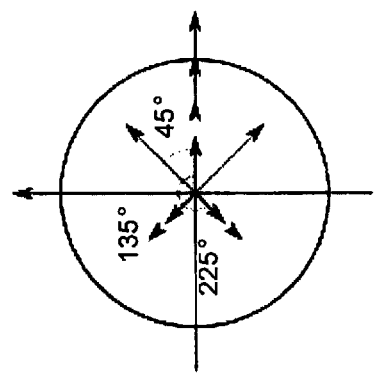
FIG. 12B

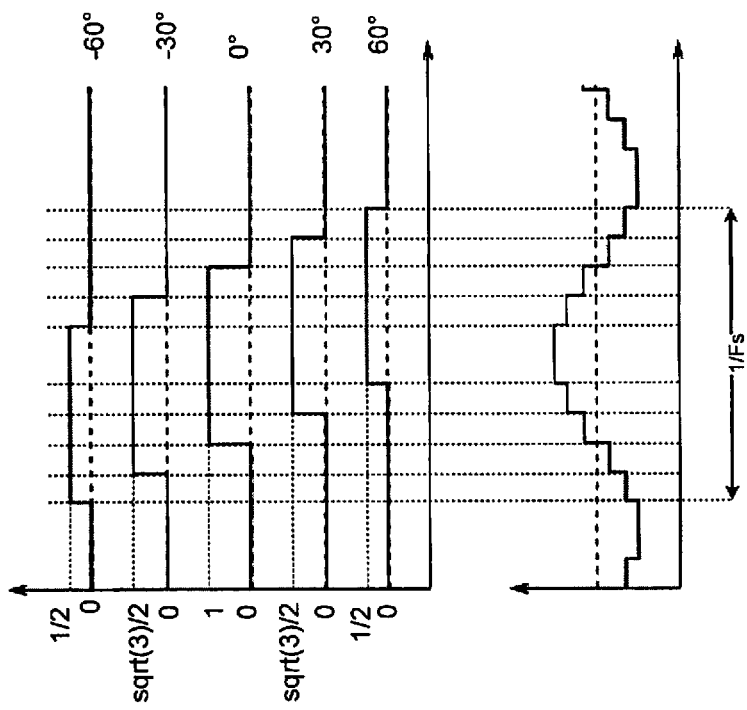
FIG. 13A
FIG. 13C
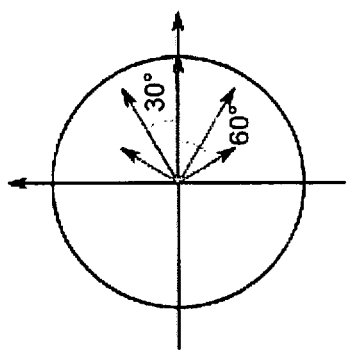
FIG. 13B

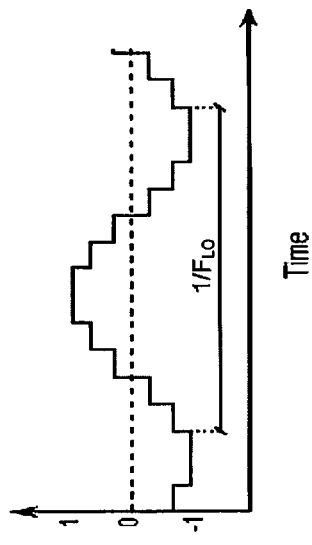
FIG. 14A
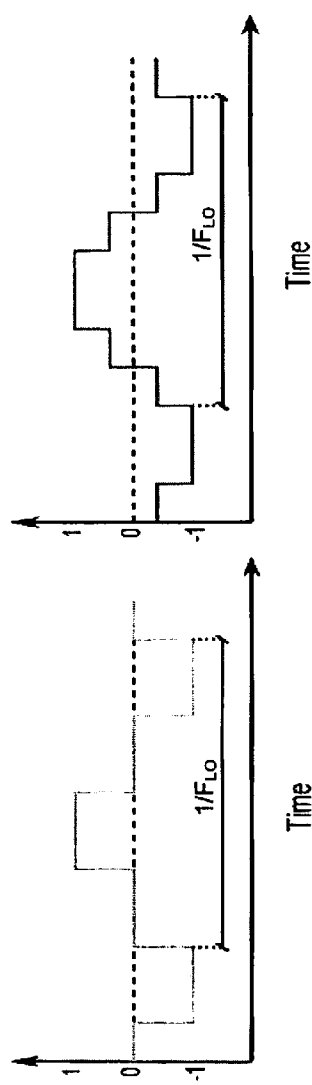
FIG. 14C
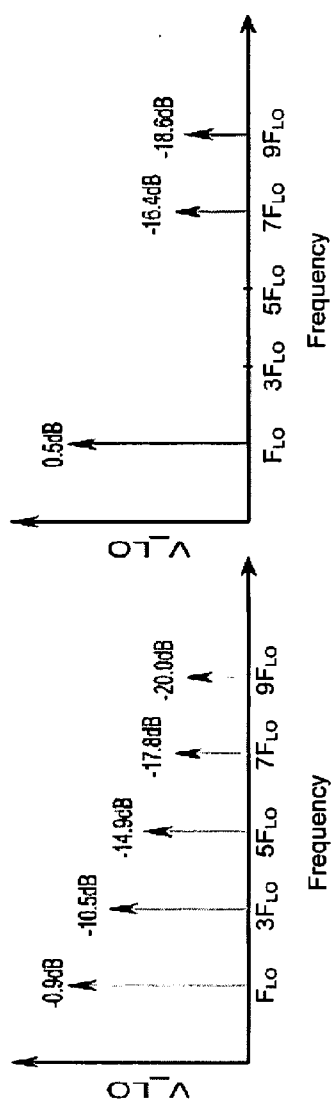
FIG. 14E
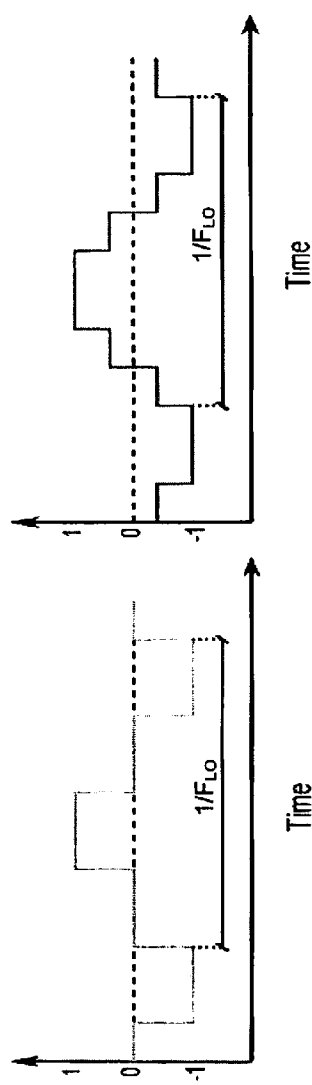
FIG. 14B
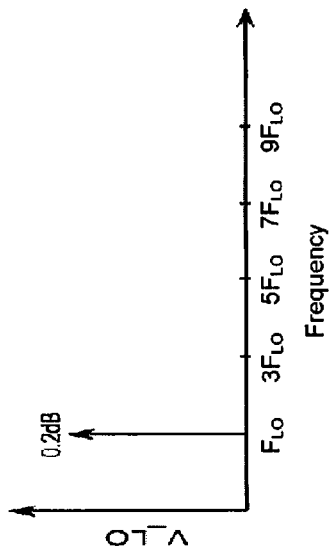
FIG. 14D
FIG. 14F

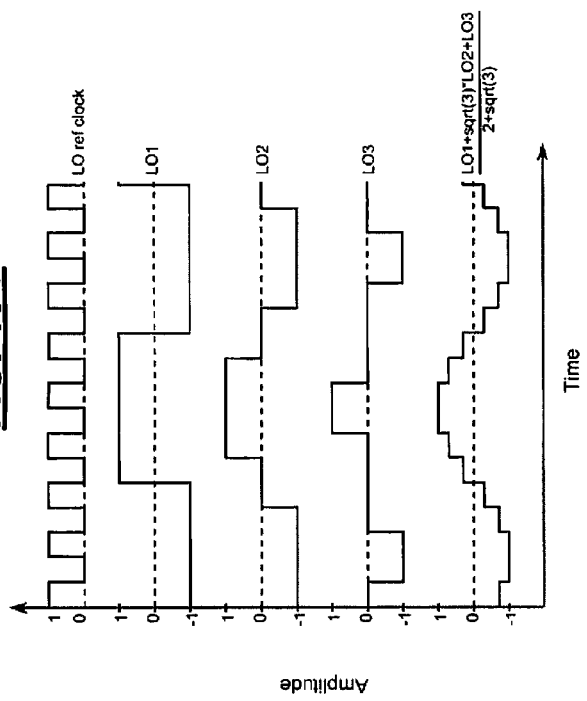
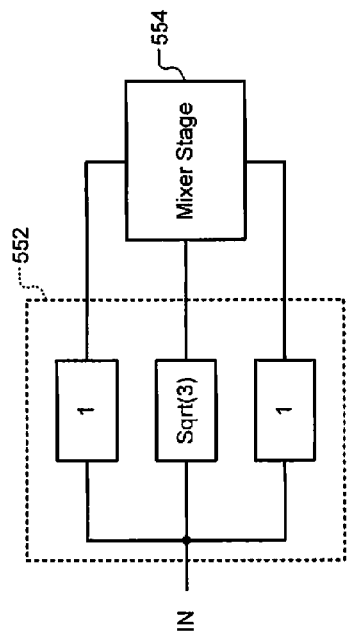
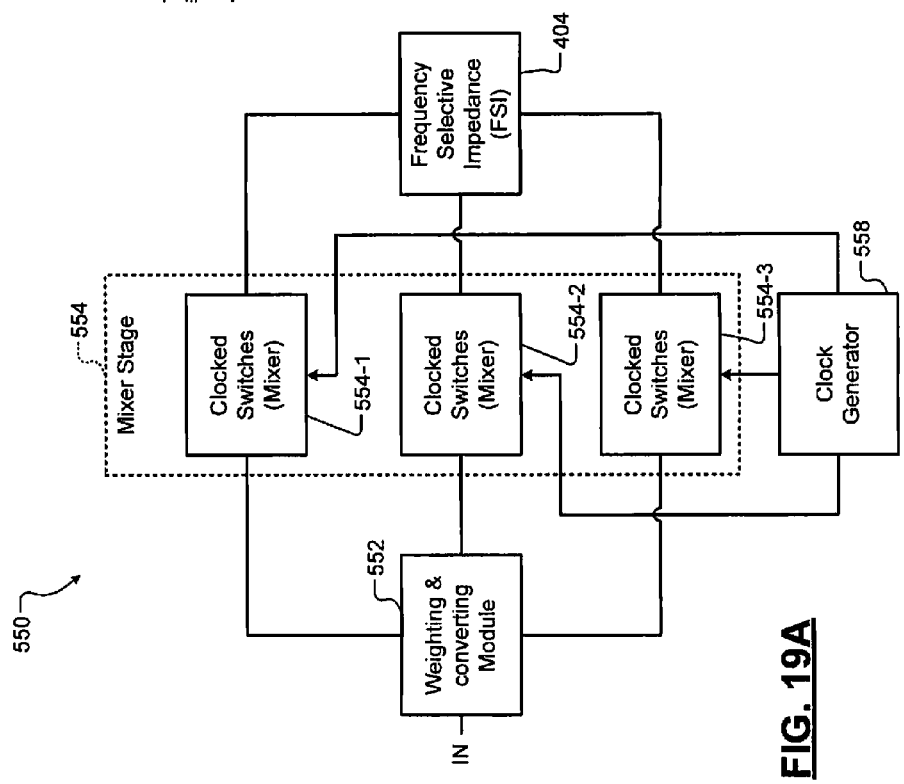
FIG. 19C
FIG. 19B
FIG. 19A

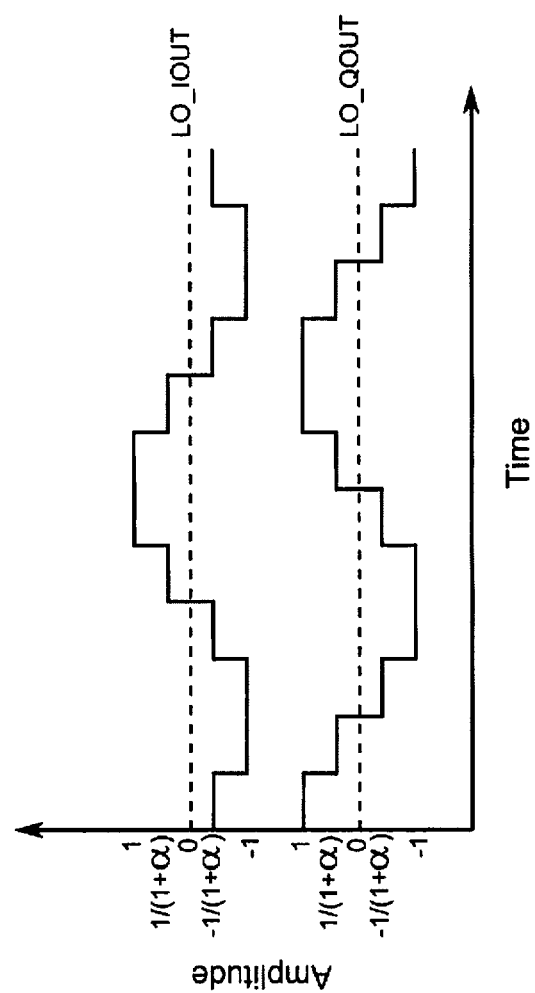

HARMONIC-REJECT FTI FILTER

CROSS-REFERENCE TO RELATED APPLICATIONS

This application claims the benefit of U.S. Provisional Application No. 61/178,455, filed on May 14, 2009.

This application is related to U.S. patent application Ser. No. 12/018,933 filed on Jan. 24, 2008.

The disclosures of the above applications are incorporated herein by reference in their entirety.

FIELD

The present disclosure relates to communication systems and more particularly to filter circuits.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Referring now to FIGS. 1-3C, wireless network devices typically transmit and receive radio frequency (RF) signals via RF transceivers. FIG. 1 shows a RF transceiver. FIG. 2 shows RF signals including wanted and unwanted RF signals that an RF transceiver may receive via a source such as an antenna. FIGS. 3A and 3B show different configurations of RF transceivers that can simultaneously transmit and receive RF signals. FIG. 3C shows a duplexer that may be a source of unwanted RF signals.

In FIG. 1, an RF transceiver 100 that transmits and receives RF signals in wireless communication systems is shown. The RF transceiver 100 may transmit and receive RF signals in a desired frequency band. The RF transceiver 100 may comprise a transmitter 102 that transmits RF signals and a receiver 104 that receives RF signals via an antenna 106. The transmitter 102 may be a super-heterodyne transmitter, a direct conversion transmitter, or other suitable transmitter. The receiver 104 may be a super-heterodyne receiver, a direct conversion receiver, or other suitable receiver. The RE transceiver 100 may be implemented by an integrated circuit (IC).

Transmitters and receivers generate unwanted signal components called intermodulation components due to non-linearity of circuit blocks. For example, receivers may generate intermodulation components due to non-linearity of low-noise amplifiers, transconductors, mixers, amplifiers, and filters. Mixers are a significant source of nonlinearity, particularly in direct conversion receivers.

When receivers receive a wanted channel at a small power level together with unwanted signals with relatively larger power, intermodulation components may fall on or near the wanted channel and reduce receiver performance. Receivers typically use mixers to convert input signals associated with one carrier frequency to output signals having another carrier frequency called an intermediate frequency (IF) or to baseband as in receivers employing direct conversion architecture. Generally, receivers may receive unwanted input signals having relatively large power from different sources.

In FIG. 2, the receiver 104 may receive signals having different frequencies and amplitudes via the antenna 106. For example, the receiver 104 may receive wanted signal 108 having frequencies in the desired frequency band. Additionally, the receiver 104 may receive unwanted or interfering signals called blockers. Blockers may be of two types: in-band blockers 110 that have frequencies in the desired frequency band and out-of-band blockers 112 that have frequencies outside the desired frequency band. The power of the blockers 110, 112 may be greater than the power of the wanted channel 108. Consequently, the blockers 110, 112 may generate unwanted intermodulation components when received by the receiver 104.

Additionally, signals transmitted by the transmitter 102 may be a source of blockers in some systems. For example, in wideband code division multiple access (WCDMA) systems, RF transceivers may comprise RF front-end modules that include duplexers. The RF transceivers may simultaneously transmit and receive data using the duplexers.

In FIG. 3A, a WCDMA transceiver 100-1 may comprise an RF front-end module 114, an RF downconverter module 116, and the transmitter 102. In some implementations, the RF front-end module 114 may comprise filter circuits and may be implemented external to an RF transceiver 100-2 as shown in FIG. 3B.

In FIGS. 3A and 3B, the RF front-end module 114 may communicate with the antenna 106, the RF downconverter module 116, and the transmitter 102. The RF downconverter module 116 may include mixers (not shown) that downconvert the RF signals received from the antenna 106. The RF front-end module 114 may comprise filters, amplifiers, etc. that the receiver 104 and/or the transmitter 102 may utilize. Accordingly, the receiver 104 may include the RF downconverter module 116 and a portion of the RF front-end module 114 that the receiver 104 may utilize.

In FIG. 3C, the RF front-end module 114 may comprise a duplexer 120 and a power amplifier 122. The RF transceiver 100-2 may simultaneously transmit and receive data via the duplexer 120. The power amplifier 122 may amplify signals output by the transmitter 102. When the RF transceiver 100-2 transmits data, the duplexer 120 may output the amplified signals received from the power amplifier 122 to the antenna 106.

When the RF transceiver 100-2 receives data, the duplexer 120 may receive RF signals from the antenna 106 and may output the signals received from the antenna 106 to the RF downconverter module 116. Additionally, the duplexer 120 may inject residual signals, which are attenuated portions of the amplified signals output by the power amplifier 122, into the RF downconverter module 116.

Despite being attenuated, the residual signals may have a power level significantly greater than the power of the wanted channel received from the antenna 106. Consequently, the residual signals may appear as large blockers at the input of the RF downconverter module 116 resulting in the generation of unwanted intermodulation components in the RF downconverter module 116.

SUMMARY

A system comprises a weighting module, a mixer module, and a frequency selective impedance (FSI). The weighting module is configured to receive an input signal having an amplitude and to generate weighted outputs. Amplitudes of the weighted outputs have ratios relative to the amplitude of the input signal. The mixer module has switches configured to receive the weighted outputs and to generate a staircase waveform when the switches are clocked by clock signals. Amplitudes of steps of the staircase waveform are based on the ratios. The FSI is configured to communicate with the switches. The switches are configured to translate an impedance of the FSI centered on a first frequency to a second frequency determined by a frequency of the clock signals.

In another feature, a number of steps per cycle of the staircase waveform is based on a number of harmonics of the clock signals to be rejected from an output of the mixer module.

In other features, the switches are configured to further mix the weighted outputs based on the staircase waveform to generate a filtered signal. A number of harmonics of the clock signals are removed from the filtered signal.

In other features, the system further comprises a clock generator configured to generate the clock signals. A frequency of the clock signals is equal to a frequency of the input signal.

In still other features, a system comprises a weighting module, first and second mixer modules, and first and second frequency selective impedances (FSIs). The weighting module is configured to receive an input signal having an amplitude and to generate weighted outputs. Amplitudes of the weighted outputs have ratios relative to the amplitude of the input signal. The first mixer module has first switches configured to receive the weighted outputs and to generate a first staircase waveform when the first switches are clocked by first clock signals. The second mixer module has second switches configured to receive the weighted outputs and to generate a second staircase waveform when the second switches are clocked by second clock signals. The first and second FSIs are configured to communicate with the first and second switches, respectively. The first switches are configured to translate an impedance of the first FSI centered on a first frequency to a second frequency determined by a frequency of the first and second clock signals. The second switches are configured to translate an impedance of the second FSI centered on the first frequency to the second frequency.

In still other features, a method comprises receiving an input signal having an amplitude and generating weighted outputs based on the input signal. Amplitudes of the weighted outputs have ratios relative to the amplitude of the input signal. The method further comprises generating a staircase waveform based on the weighted outputs using switches clocked by clock signals. Amplitudes of steps of the staircase waveform are based on the ratios. The method further comprises translating an impedance of a frequency selective impedance (FSI) centered on a first frequency to a second frequency determined by a frequency of the clock signals. The FSI includes a filter circuit. A number of steps per cycle of the staircase waveform is based on a number of harmonics of the clock signals to be rejected from an output of the mixer module.

In other features, the method further comprises mixing the weighted outputs based on the staircase waveform to generate a filtered signal and removing a number of harmonics of the clock signals from the filtered signal.

In other features, the method further comprises generating the clock signals, wherein a frequency of the clock signals is equal to a frequency of the input signal.

In still other features, the systems and methods described above are implemented by a computer program executed by one or more processors. The computer program can reside on a tangible computer readable medium such as but not limited to memory, nonvolatile data storage, and/or other suitable tangible storage mediums.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 1 is a functional block diagram of an radio frequency (RF) transceiver;

FIG. 2 is a graph of amplitude versus frequency of RF signals;

FIGS. 3A and 3B are functional block diagrams of RF transceivers;

FIG. 3C is a functional block diagram of an RF transceiver utilizing a duplexer;

FIGS. 4A and 4B are functional block diagrams of receivers utilizing an LNA and a frequency translatable impedance (FTI) filter;

FIGS. 4C and 4D depict frequency responses of the input impedance of the FTI filter of FIG. 4A;

FIGS. 9A and 9B depict clock signals of a FTI filter in time domain and frequency domain, respectively;

FIG. 10 depicts effects of folding back at an output of a FTI filter in frequency domain;

FIGS. 12A-12C depict rejection of $3^{rd}$ and $5^{th}$ harmonics;

FIGS. 13A-13C depict rejection of $3^{rd}$, $5^{th}$, $7^{th}$, and $9^{th}$ harmonics;

FIGS. 14A and 14B depict a clock spectrum with $3^{rd}$, $5^{th}$, $7^{th}$, and $9^{th}$ harmonics in time domain and frequency domain, respectively;

FIGS. 14C and 14D depict a clock spectrum without $3^{rd}$ and $5^{th}$ harmonics in time domain and frequency domain, respectively;

FIGS. 14E and 14F depict a clock spectrum without $3^{rd}$, $5^{th}$, $7^{th}$, and $9^{th}$ harmonics in time domain and frequency domain, respectively;

FIGS. 19A-19C depict a functional block diagram of a harmonic reject FTI filter that rejects $3^{rd}$, $5^{th}$, $7^{th}$, and $9^{th}$ harmonics and associated clock signals;

FIGS. 21A-21D depict a schematic of a quadrature harmonic reject FTI filer that rejects $3^{rd}$ and $5^{th}$ harmonics and associated clock generator and clock signals.

DESCRIPTION

Figure 5B:
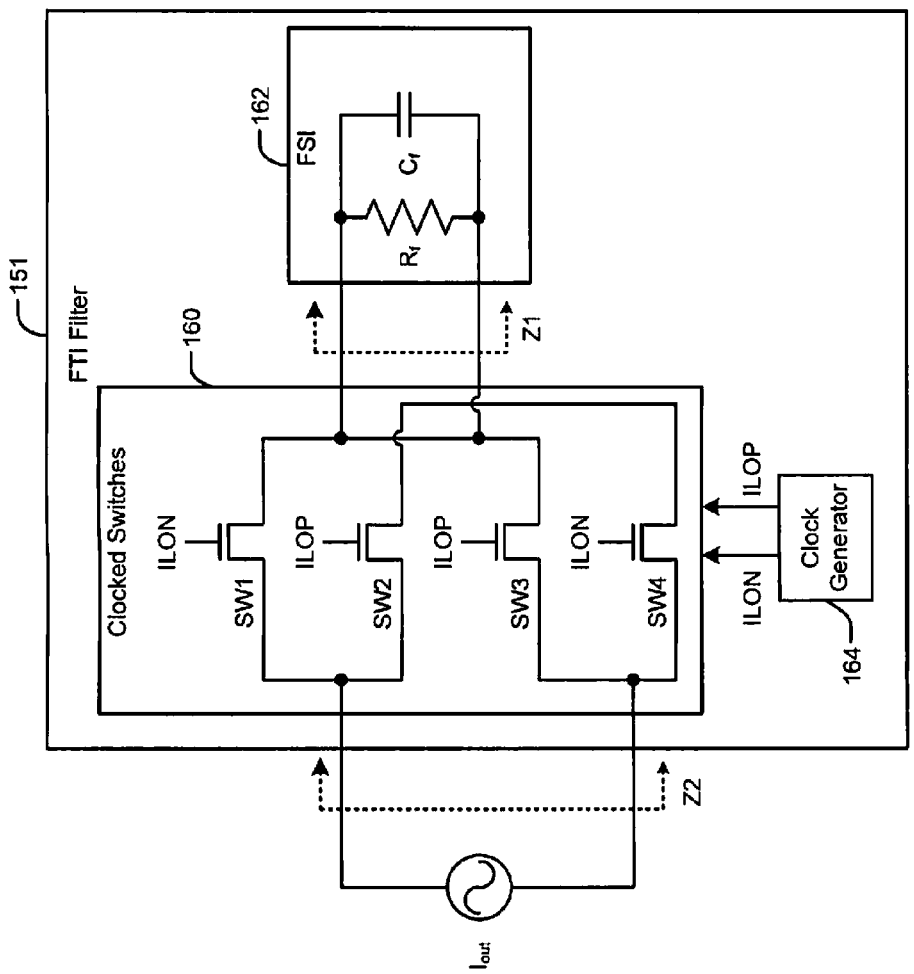
FIGS. 5A and 5B depict a functional block diagram and a schematic of a FTI filter.

The following description includes examples and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Frequency translatable impedance (FTI) filters can be used to attenuate blockers. The FTI filters can have tunable center frequencies and Q-factors, where a Q-factor is a ratio of a resonant frequency to bandwidth. Consequently, the FTI filters can attenuate blockers of various frequencies. The FTI filters can be used in conjunction with conventional resistance-inductance-capacitance (RLC) filter circuits and other conventional filters.

Typically, an FTI filter comprises switches, a frequency selective impedance (FSI), and a clock generator. The FSI may have a low-pass, high-pass, notch, or a combination characteristic, and may be referred to as a low-pass FSI, high-pass FSI, notch FSI, or a combination FSI, respectively. The clock generator generates clock signals that clock the switches.

The FTI filter translates an impedance of a frequency selective circuit centered on one frequency to another frequency determined by the frequency of the clock signals. Specifically, the switches, acting as a mixer, translate the response of the FSI in frequency. For example, when a low-pass FSI is used in an FTI filter, the low-pass FSI is frequency translated, resulting in a band-pass impedance.

Additionally, the FTI filter is tunable in both frequency and bandwidth. For example, when the low-pass FSI is frequency translated to a bandpass impedance, the center frequency of the bandpass impedance will be at or near the clock frequency. The Q-factor of the FTI filter can be changed by modifying the low-pass FSI.

Typically, clock signals (square waveforms) with a 25% duty cycle are used to clock the switches of the FTI filter. A spectrum of the clock signals comprises odd overtones ($3^{rd}$, $5^{th}$, $7^{th}$, ... harmonics) of a fundamental clock frequency. In the FTI filter, an RF input signal is downconverted to baseband, where it is filtered by the FSI. The filtered signal is then upconverted to RF. In this process, odd harmonics of the clock signals mix with the input signal, resulting in unwanted tones at the output of the FTI filter.

Specifically, blockers may occur at the frequencies of the odd harmonics. Additionally, noise (e.g., white noise) introduced by components preceding the FTI filter may be present at the frequencies of the odd harmonics. The noise and blockers present at the frequencies of the odd harmonics fold back and are added to the filtered output signal. This folding back of the noise and the blockers is called noise folding and blocker aliasing, respectively.

The noise folding and blocker aliasing generate the unwanted overtones in the output of the FTI filter. Particularly, the noise folding decreases the signal-to-noise ratio (SNR) at the output of the FTI filter. Additionally, when a strong blocker folds back, the blocker aliasing decreases the in-band signal-to-interference (SIR). The degradation of the SNR and of the SIR due to noise and blocker aliasing respectively may be reduced by rejecting the odd harmonics of the mixer function, by using for example a dedicated clock scheme and input signal weighting.

The present disclosure relates to rejection of the odd harmonics in FTI filters. The odd harmonics can be rejected by generating clock signals having a staircase waveform and by adding a weighting stage preceding the FTI filter. Specifically, the number of time steps (stairs) in a clock period of the clock signals can be set depending on the harmonics to be rejected. Additionally, the input signal may be divided into multiple weighted signals before being input to the FTI filter. The weights determine the amplitudes of the time steps.

After filtering by the FTI filter using appropriate weighting and clock signals, the outputs of the switches are combined to generate a single output. Filtering performed in this manner rejects the odd harmonics of the clock signals and prevents noise and blocker folding at the frequencies of the odd harmonics. Accordingly, the in-band SNR and SIR at the output of the FTI filter are improved. Before describing harmonic rejection in detail, an overview of operation of the FTI filter is presented.

Figure 7B:
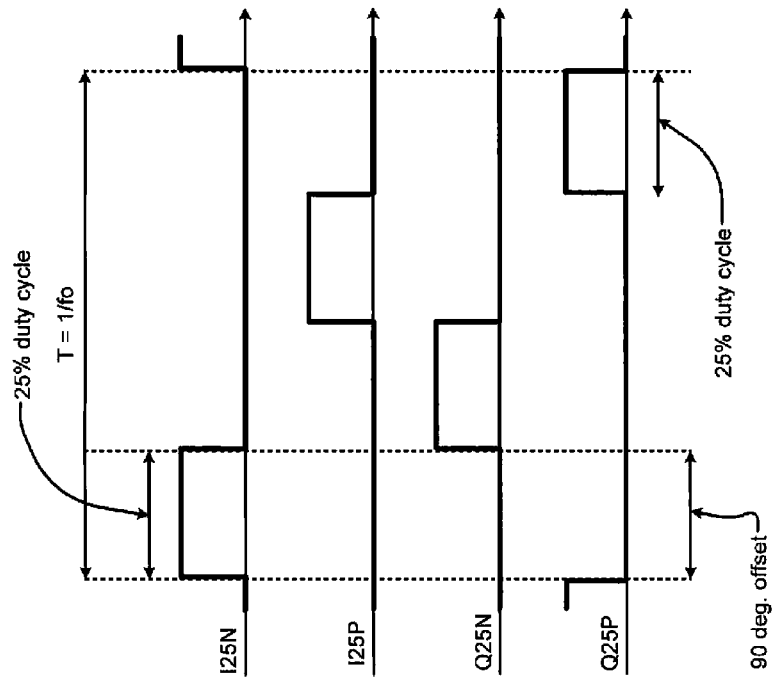
FIGS. 7A and 7B depict a schematic and associated clock signals of a FTI filter having a quadrature configuration, respectively.

Referring now to FIGS. 4A-7B, different configurations and characteristics of the FTI filter are shown. FIGS. 4A-4D show a FTI filter and its frequency response. FIGS. 5A and 5B show schematics of FTI filters. FIGS. 6A and 6B show a low-pass FSI translated by the clocked switches to a bandpass impedance of the FTI filter. FIGS. 7A and 7B show a FTI filter comprising two sets of clocked switches and FSIs arranged in a quadrature configuration.

In FIG. 4A, a receiver 104-1 may comprise an amplifier 115 (e.g., a LNA), an FTI filter 151, and the RF downconverter module 116. The amplifier 115 may receive RF input signals. The FTI filter 151 is a shunt filter that attenuates blockers relative to the wanted channel. For example only, the FTI filter 151 may have a bandpass response and may be clocked at the wanted channel frequency. The RF downconverter module 116 may downconvert the wanted signal.

In FIG. 4B, a receiver 104-2 may comprise an IC 152 and a RF front-end module 114-1 that receives RF input signals. In some implementations, the IC 152 may include the RF front-end module 114-1. The IC 152 comprises the FTI filter 151 and the RF downconverter module 116. An LNA 124 can be implemented off-chip in the RF front-end module 114-1. Alternatively, although not shown, the LNA 124 can be integrated on the IC 152 with the FTI filter 151.

The LNA 124 may include a transconductance amplifier that converts an input voltage $V_{in}$ to an output current $I_{out}$. The FTI filter 151 may filter or attenuate blockers present in the output of the LNA 124. The output of the LNA 124 with blockers filtered or attenuated by the FTI filter 151 is input to the RF downconverter module 116.

The RF downconverter module 116 may comprise an LNA 128 and a downconversion mixer 105. The downconversion mixer 105 may include mixers 132 and 134 arranged in a quadrature configuration. An oscillator 136 and a 90-degree phase shifter 138 may generate clock signals that clock the mixers 132 and 134, respectively. The mixers 132 and 134 may generate in-phase (I) and quadrature (Q) outputs, respectively. The I and Q outputs may be input to a baseband processor (not shown) for further processing.

Typically, most conventional filters are connected as in-line filters. That is, most conventional filters are connected in series to the RF downconverter module 116. In contrast, in classical implementations, the FTI filter 151 and the RF downconverter module 116 communicate with the same input node. In other words, the FTI filter 151 and the RF downconverter module 116 independently communicate with the same input node and receive the same input signals. Thus, the FTI filter 151 and the RF downconverter module 116 may be considered to be in parallel.

The FTI filter 151 may present a frequency dependent load to the LNA 124. Specifically, the FTI filter 151 may have an input impedance Z. The input impedance Z of the FTI filter 151 may vary based on the frequency of the output current $I_{out}$. For example, Z may be low at some frequencies and high at other frequencies.

In FIG. 4C, Z may be low at some frequencies. Effectively, the FTI filter 151 may dissipate energy of signals having frequencies at which Z is relatively low. Thus, the FTI filter 151 may filter out blockers when blockers have frequencies at which Z is relatively low. In other words, the FTI filter 151 may function as a notch filter at frequencies where Z is low and may filter blockers having frequencies at which Z is low.

Conversely, in FIG. 4D, Z may be high at other frequencies. Consequently, the FTI filter 151 may pass signals that have frequencies at which Z is high to the RF downconverter module 116. Effectively, the FTI filter 151 may function as a band-pass filter at frequencies at which Z is high. Thus, when wanted signals have frequencies, at which Z is high, the FTI filter 151 may pass the wanted signals to the RF downconverter module 116.

Blockers may be present in different frequency bands. Accordingly, a single FTI filter having tunable (i.e., programmable) Q-factor and center frequency can be programmed to filter blockers at different frequencies in different frequency-bands. Alternatively, in some classical implementations, multiple FTI filters clocked at different frequencies may be connected in parallel to attenuate blockers at different frequencies.

Figure 5A:
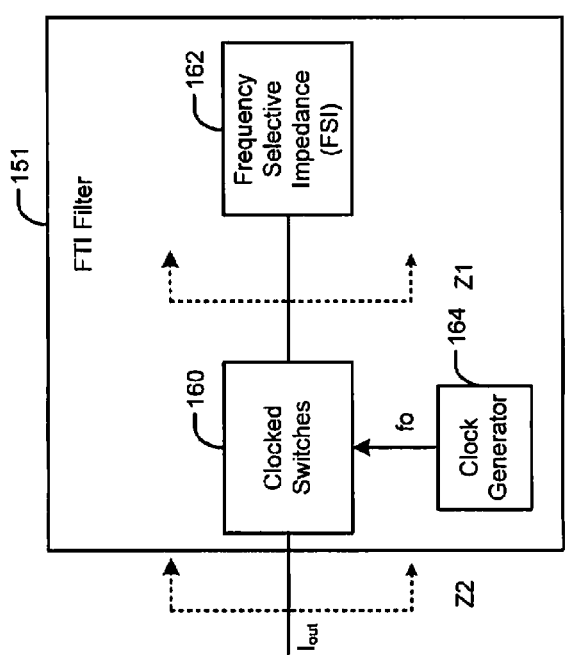

In FIGS. 5A and 5B, an example of the FTI filter 151 with tunable Q-factor and center frequency is shown. In FIG. 5A, the FTI filter 151 may comprise clocked switches 160, an FSI 162, and a clock generator 164. The FSI 162 may have an input impedance Z1, and the FTI filter 151 may have an input impedance Z2.

In FIG. 5B, the clocked switches 160 may comprise four switches SW1, SW2, SW3, and SW4. The switches SW1-SW4 may be implemented with NMOS and/or PMOS, using CMOS technologies or other technologies. Throughout the present disclosure, switches are shown using transistors (e.g., see FIGS. 5B and 7A) or using a switch symbol instead (e.g., see FIGS. 8A, 21A, and 22A). Use of a transistor or a switch symbol is merely representative and therefore interchangeable. The clock generator 164 may generate clock signals ILON and ILOP at a clock frequency $f_o$. The clock signals ILON and ILOP may clock the switches SW1-SW4 at a predetermined duty cycle.

For example only, the FSI 162 is shown as a low-pass FSI comprising a RC circuit, wherein a resistance $R_f$ and a capacitance $C_f$ are connected in parallel. Instead, any type of filter, including passive and/or active filters of different orders, can be used.

Figure 6A:
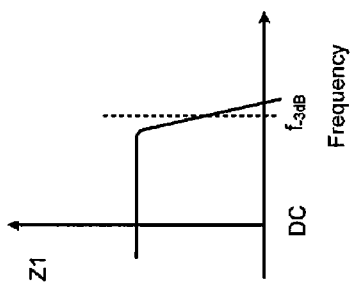
FIGS. 6A and 6B depict characteristics of a FTI filter.
Figure 6B:
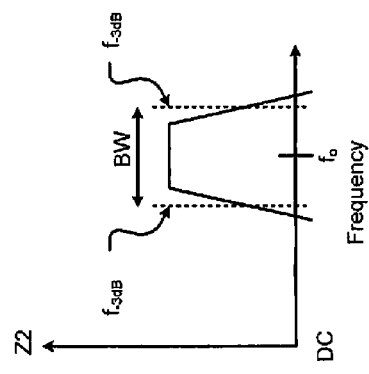

In FIGS. 6A and 6B, frequency characteristics of impedances Z1 and Z2 are shown. As an example, in FIG. 6A, the impedance Z1 of the FSI 162 may have a low-pass characteristic. At low frequencies, Z1 may be approximately equal to R1 since capacitance $C_f$ may function as an open circuit at low frequencies. The impedance Z1 decreases as the frequency approaches and then exceeds a frequency called a −3 dB cutoff frequency ($f_{-3dB}$), where $f_{-3dB}$ is defined by a time constant ($R_f*C_f$) of the FSI 162 where $R_f$ may be equal to $R_1$. In other words, the FSI 162 may dissipate energy at frequencies approaching or greater than $f_{-3dB}$ when the impedance Z1 of the FSI 162 has a low-pass characteristic.

The FSI 162 may dissipate energy at different frequencies depending on the frequency characteristic of the impedance Z1. Impedance Z1 may have a low-pass, high-pass, notch, or a combination characteristic when the FSI 162 has a low-pass, high-pass, notch, or a combination characteristic, respectively.

In FIG. 6B, the clocked switches 160 may translate the low-pass characteristic of the impedance Z1 so that the impedance Z2 of the FTI filter 151 may have a band-pass characteristic centered at or near the clock frequency $f_o$. Specifically, the impedance Z2 may appear as impedance Z1 centered at or near the clock frequency $f_o$. Consequently, the FTI filter 151 may function as a band-pass filter when the FSI 162 has a low-pass characteristic. The wanted signal will see high impedance and pass through, while the blockers will see lower impedance and get attenuated. Accordingly, the FTI filter 151 may pass the signal of wanted frequency to the RF downconverter module 116 since the FSI 162 functions as a resistor in the wanted frequency-band in the vicinity of the clock frequency $f_o$.

The FTI filter 151 filters or attenuates blockers having frequencies outside the $f_{-3dB}$ bandwidth (BW) since the FSI 162 dissipates energy at the frequencies outside the BW. In other words, the clocked switches 160 translate the frequency of the blockers to a frequency that the FSI 162 will filter. Alternatively, the clocked switches 160 translate the impedance of the FSI 162 to the clock frequency $f_o$, where the FSI 162 can filter the blockers having frequencies more than $f_{-3dB}$ away from the frequency $f_o$.

When the FSI 162 has a low-pass impedance, the center frequency of the FTI filter 151 is determined by $f_0$, and the bandwidth of the FTI filter 151 is determined by the bandwidth of the FSI 162. The bandwidth of the FSI 162 may be determined by a time constant of the FSI 162. For example, when the FSI 162 includes an RC circuit comprising resistance $R_f$ and capacitance $C_f$ connected in parallel, the time constant of the FSI 162 is given by $\tau=(Rf*Cf)$. The $-f_{-3dB}$ cutoff frequency of the FSI 162 is given by $f_{-3dB}=1/(2\pi*\tau)$.

The bandwidth BW of the FTI filter 151 is a function of the $f_{-3dB}$ cutoff frequency of the FSI 162. For example, when the input impedance Z1 of the FSI 162 has a low-pass characteristic having a $-f_{-3dB}$ cutoff frequency ($f_{-3dB}$) and when the input impedance Z2 of the FTI filter 151 has a band-pass characteristic, the bandwidth BW of the FTI filter 151 is generally twice $f_{3dB}$. Thus, the bandwidth BW of the FTI filter 151 may be determined based on the time constant of the FSI 162.

The Q-factor of the FTI filter 151 in the case of a bandpass characteristic is defined as a ratio of the center frequency to the bandwidth of the FTI filter 151. That is, $Q=f_o/BW$. Thus, the Q-factor of the FTI filter 151 can be varied by setting the center frequency of the FTI filter 151 equal to the clock frequency $f_o$ and by varying the clock frequency $f_0$ and/or the time constant of the FSI 162. The clock frequency $f_0$ may be less than, equal to, or greater than the frequency of the wanted signal.

The impedance Z1 may be implemented by circuits comprising a combination of R, L, and C, active circuits, switched-capacitor circuits, and RF microwave filter circuits, for example. Depending on the frequency of the blockers, the FSI 162 may be a low-pass, high-pass, notch, and/or a combination impedance, wherein the impedance Z1 may have a low-pass, high-pass, notch, and/or a combination frequency characteristic, respectively.

Impedance Z2 may have a band-pass characteristic when Z1 has a low-pass characteristic and may, over a desired frequency range, have a notch characteristic when Z1 has a high-pass characteristic. Depending on the frequency characteristics of the impedances Z1 and Z2, the FTI filter 151 may pass different wanted frequencies and may dissipate energy at frequencies of the blockers thereby attenuating the blockers.

Figure 7A:
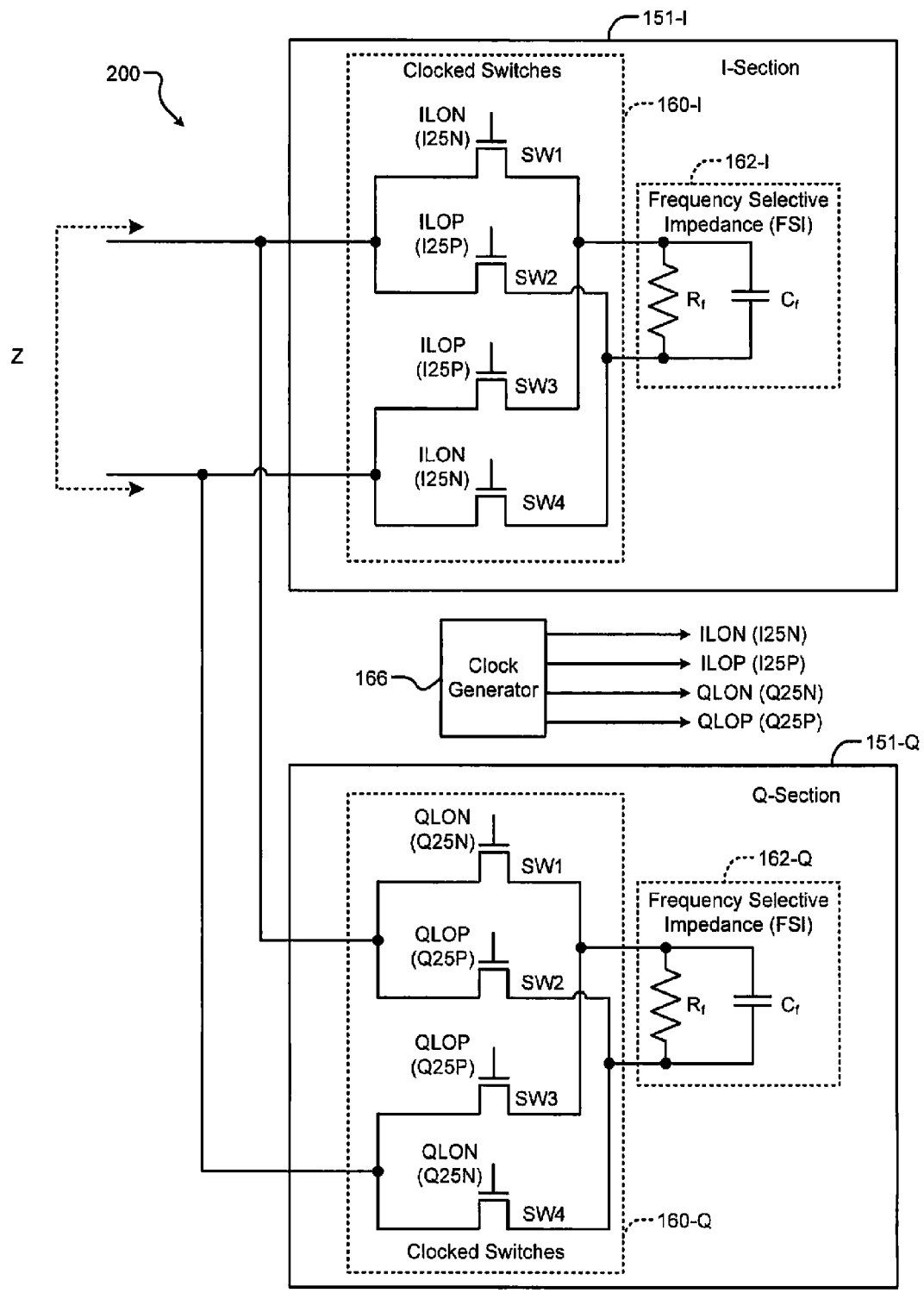

In FIGS. 7A and 7B, an FTI filter 200 that uses two sets of clocked switches and FSIs in a quadrature configuration is shown. In FIG. 7A, the FTI filter 200 comprises an in-phase section (I-section) 151-I and a quadrature-phase section (Q-section) 151-Q. The I-section 151-I may comprise first clocked switches 160-I and a first FSI 162-I. The Q-section 151-Q may comprise second clocked switches 160-Q and a second FSI 162-Q.

Additionally, the FTI filter 200 comprises a clock generator 166. The clock generator 166 may generate clock signals that clock the switches 160-1 and 160-Q at the clock frequency $f_o$ in quadrature. Specifically, clock signals 125N and 125P may clock the clocked switches 160-I, and clock signals Q25N and Q25P may clock the clocked switches 160-Q. The duty cycle of the clock signals may be 25% as shown in FIG. 7B.

The FTI filter 200 may be used as a high-Q band-pass filter with a center frequency centered at the clock frequency $f_o$ and a bandwidth determined by the bandwidth of the first and second FSIs 162-I, 162-Q. The center frequency and the Q-factor of the FTI filter 200 may be varied by varying the clock frequency $f_o$ and/or the time constants of the first and second FSIs 162-I, 162-Q. Accordingly, the FTI filter 200 may be called a FTI filter having a tunable center frequency and tunable Q-factor.

Figure 8A:
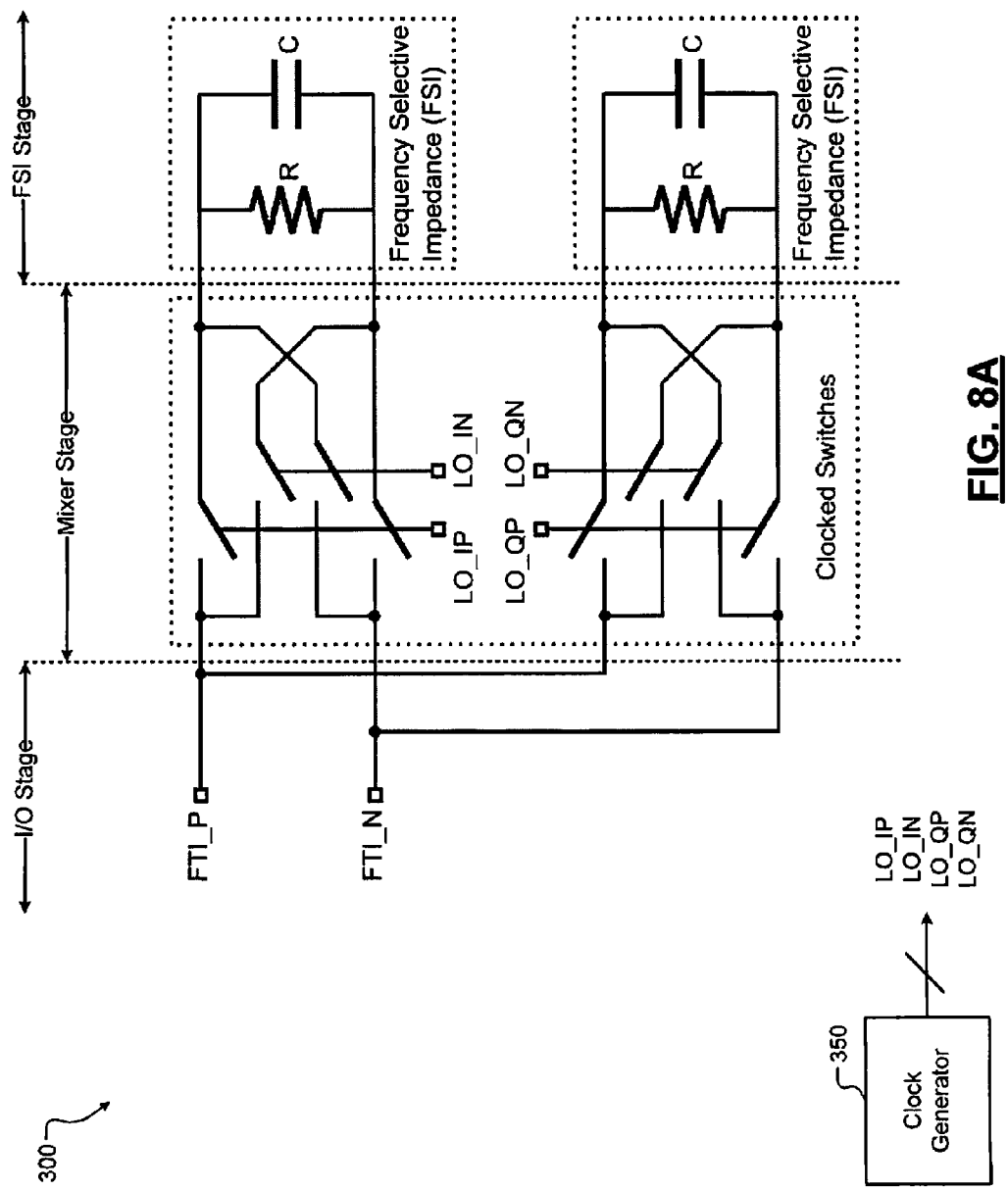
FIGS. 8A and 8B depict a schematic and associated clock signals of a FTI filter, respectively.
Figure 8B:
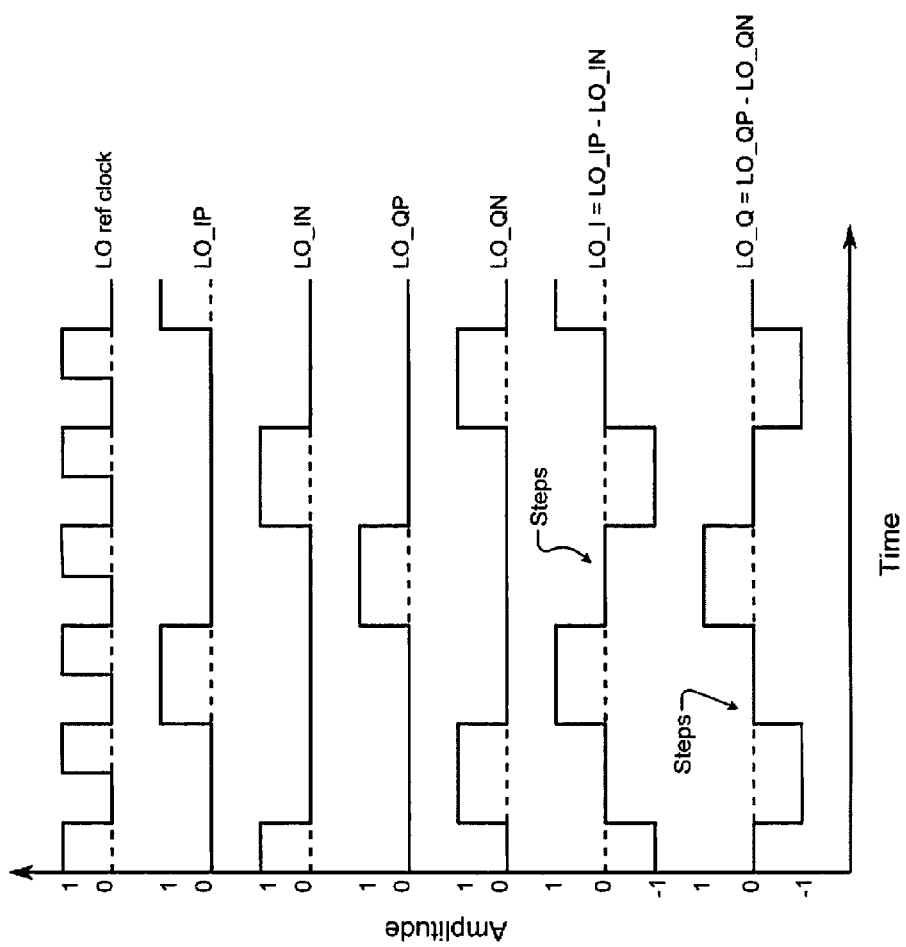
Figure 11B:
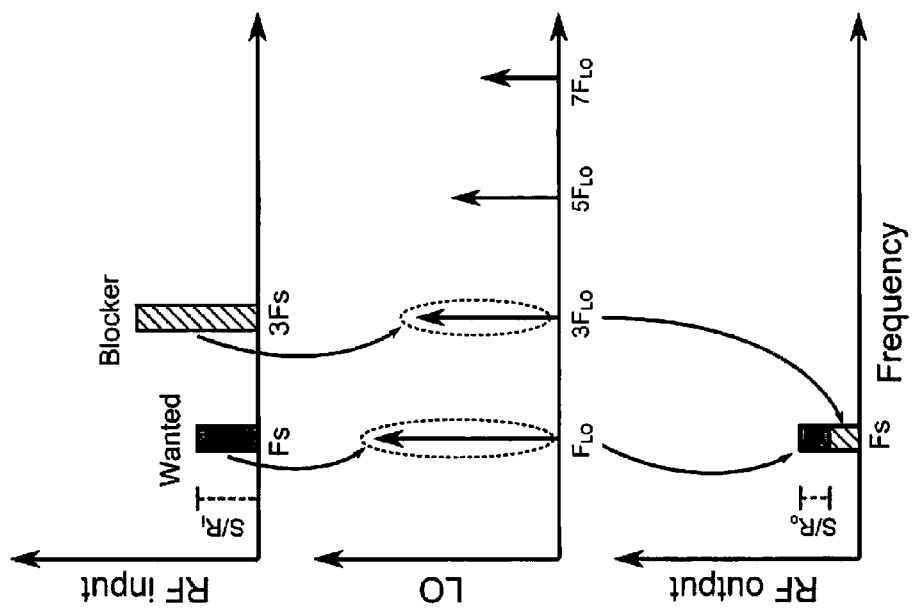
FIGS. 11A and 11B depict noise folding and aliasing in frequency domain, respectively.
Figure 11A:
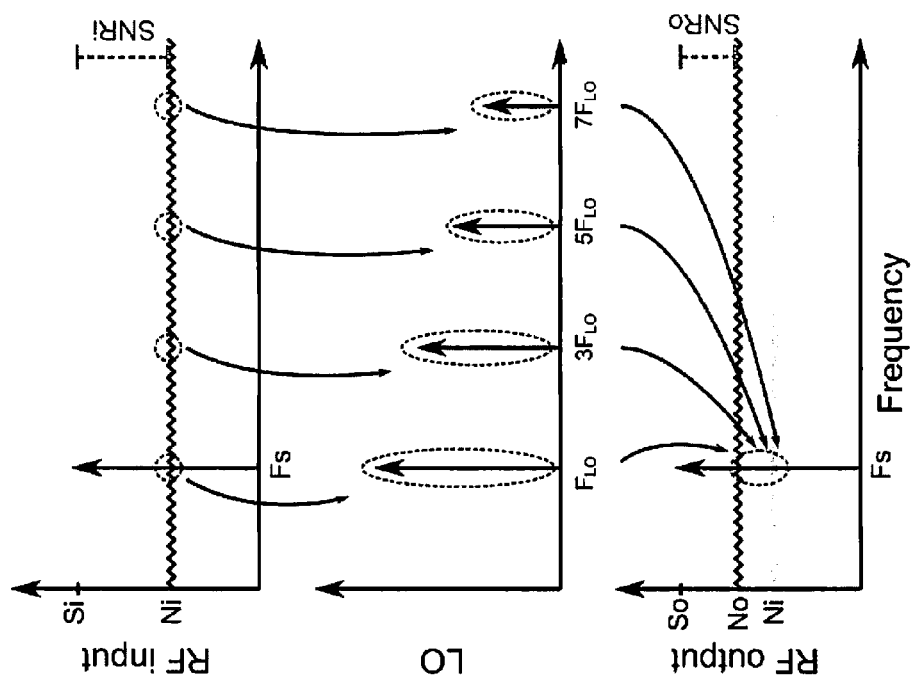

Referring generally to FIGS. 8A-22C, the detailed description of harmonic rejection according to the present disclosure is organized as follows. FIGS. 8A and 8B show a schematic and clock signals of a FTI filter. FIGS. 9A and 9B show clock signals of the FTI filter in time domain and frequency domain, respectively. FIG. 10 shows effects of clock overtones on the output of the FTI filter in frequency domain. FIGS. 11A and 11B show noise folding and blocker folding in frequency domain, respectively.

FIGS. 12A-12C show rejection of $3^{rd}$ and $5^{th}$ harmonics. FIGS. 13A-13C show rejection of $3^{rd}$, $5^{th}$, $7^{th}$, and $9^{th}$ harmonics. FIGS. 14A and 14B show a clock spectrum with $3^{rd}$, $5^{th}$, $7^{th}$, and $9^{th}$ harmonics in time domain and frequency domain, respectively. FIGS. 14C and 14D show the clock spectrum without $3^{rd}$ and $5^{th}$ harmonics in time domain and frequency domain, respectively. FIGS. 14E and 14F show the clock spectrum without $3^{rd}$, $5^{th}$, $7^{th}$, and $9^{th}$ harmonics in time domain and frequency domain, respectively.

Figure 15A:
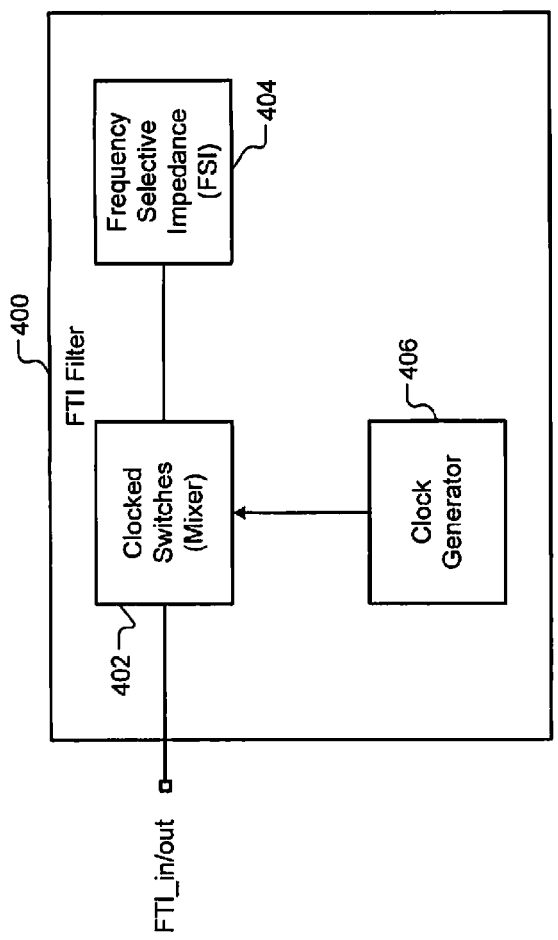
FIGS. 15A and 15B depict a functional block diagram of a FTI filter and an associated clock signal, respectively.
Figure 15B:
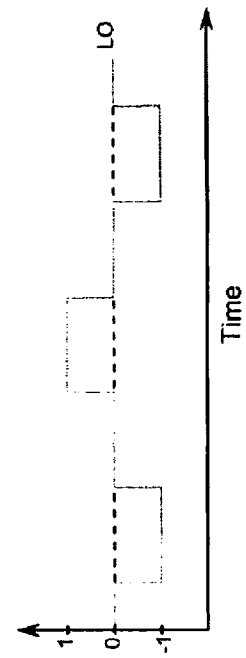
Figure 16A:
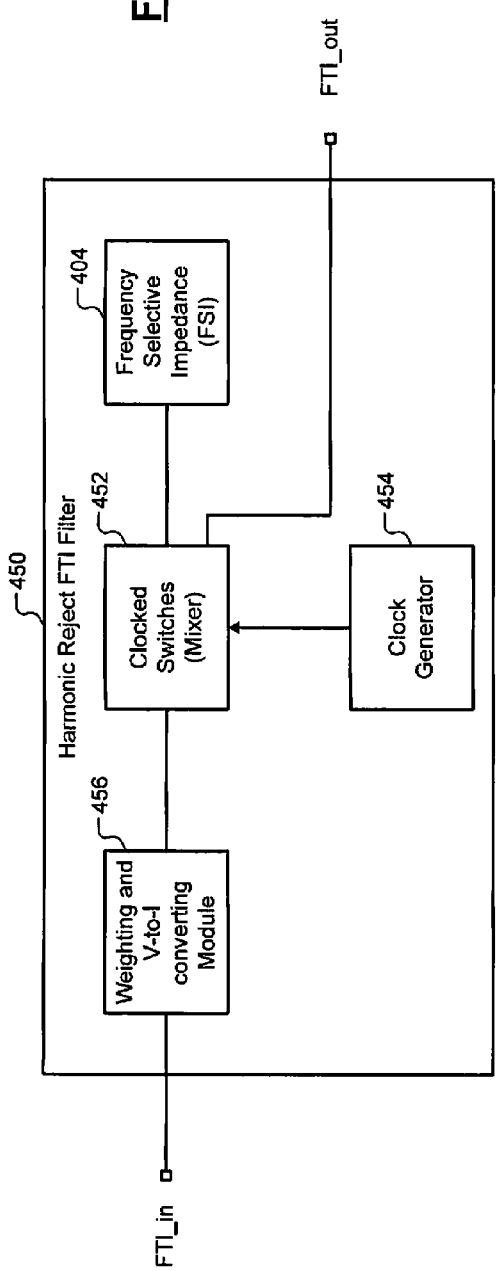
FIGS. 16A-16C depict a functional block diagram of a harmonic reject FTI filter and associated clock signals, respectively.
Figure 16B:
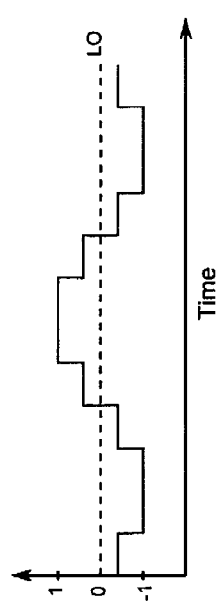
Figure 16C:
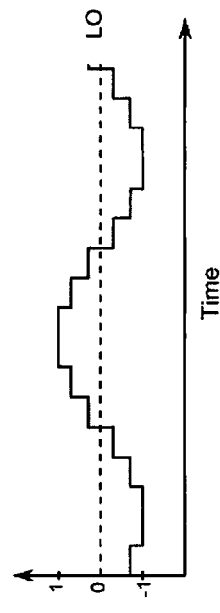
Figure 17A:
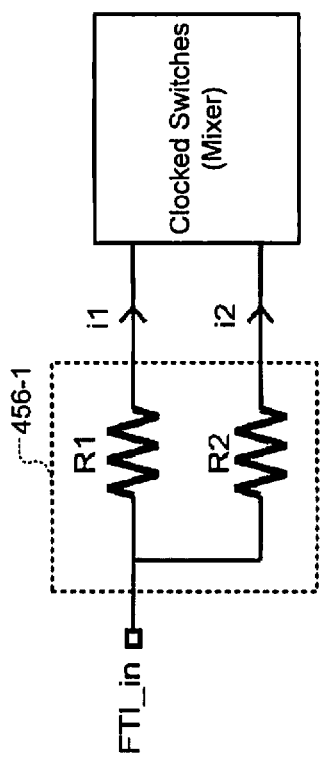
FIGS. 17A and 17B depict examples of a weighting and converting module utilized by a harmonic reject FTI filter.
Figure 17B:
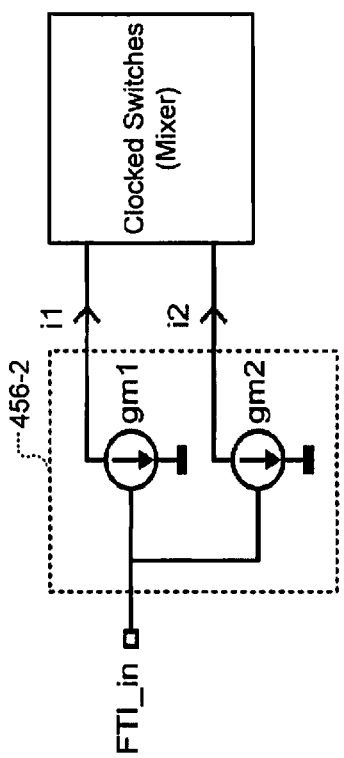
Figure 18C:
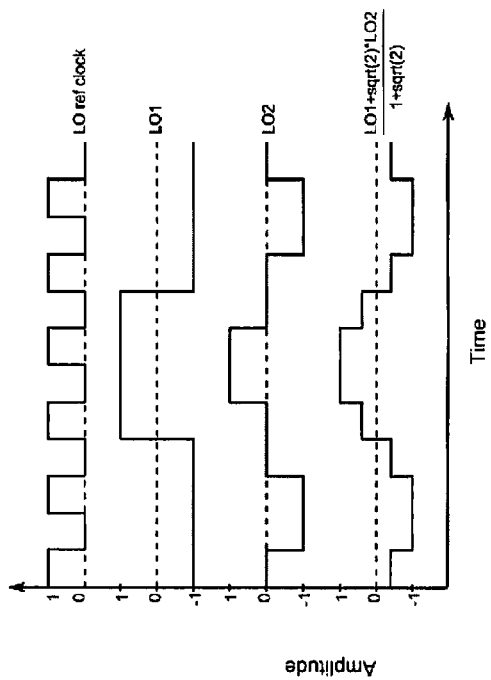
FIGS. 18A-18C depict a functional block diagram of a harmonic reject FTI filter that rejects $3^{rd}$ and $5^{th}$ harmonics and associated clock signals.
Figure 18A:
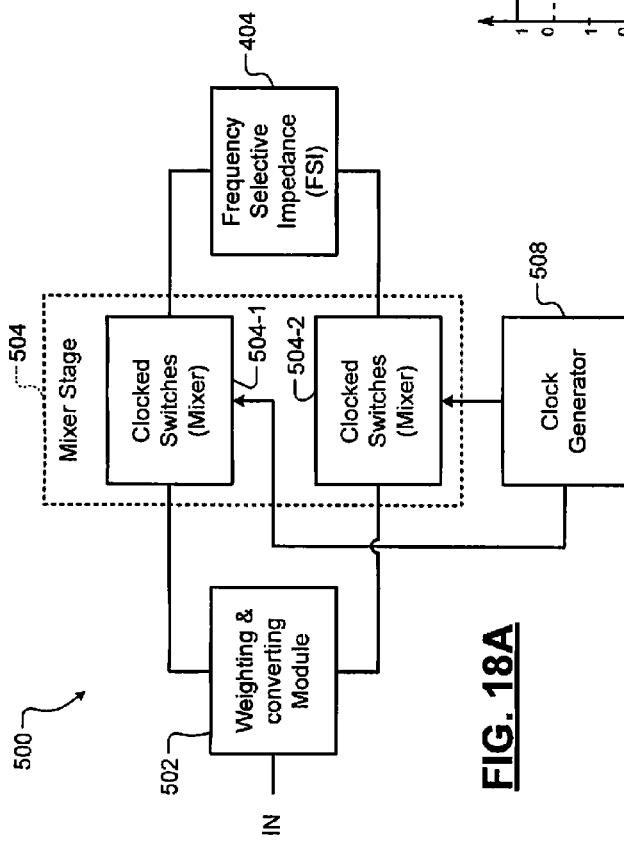
Figure 18B:
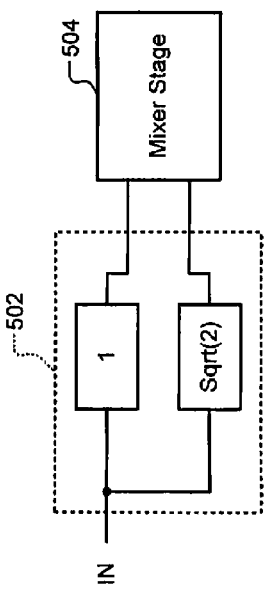

FIGS. 15A and 15B show a FTI filter and an associated clock signal, respectively. FIGS. 16A-16C show a harmonic reject FTI filter and associated clock signals, respectively. FIGS. 17A and 17B show examples of a weighting and converting module utilized by the harmonic reject FTI filter. FIGS. 18A-18C show a harmonic reject FTI filter that rejects $3^{rd}$ and $5^{th}$ harmonics and associated clock signals. FIGS. 19A-19C show a harmonic reject FTI filter that rejects $3^{rd}$, $5^{th}$, $7^{th}$, and $9^{th}$ harmonics and associated clock signals.

Figure 20:
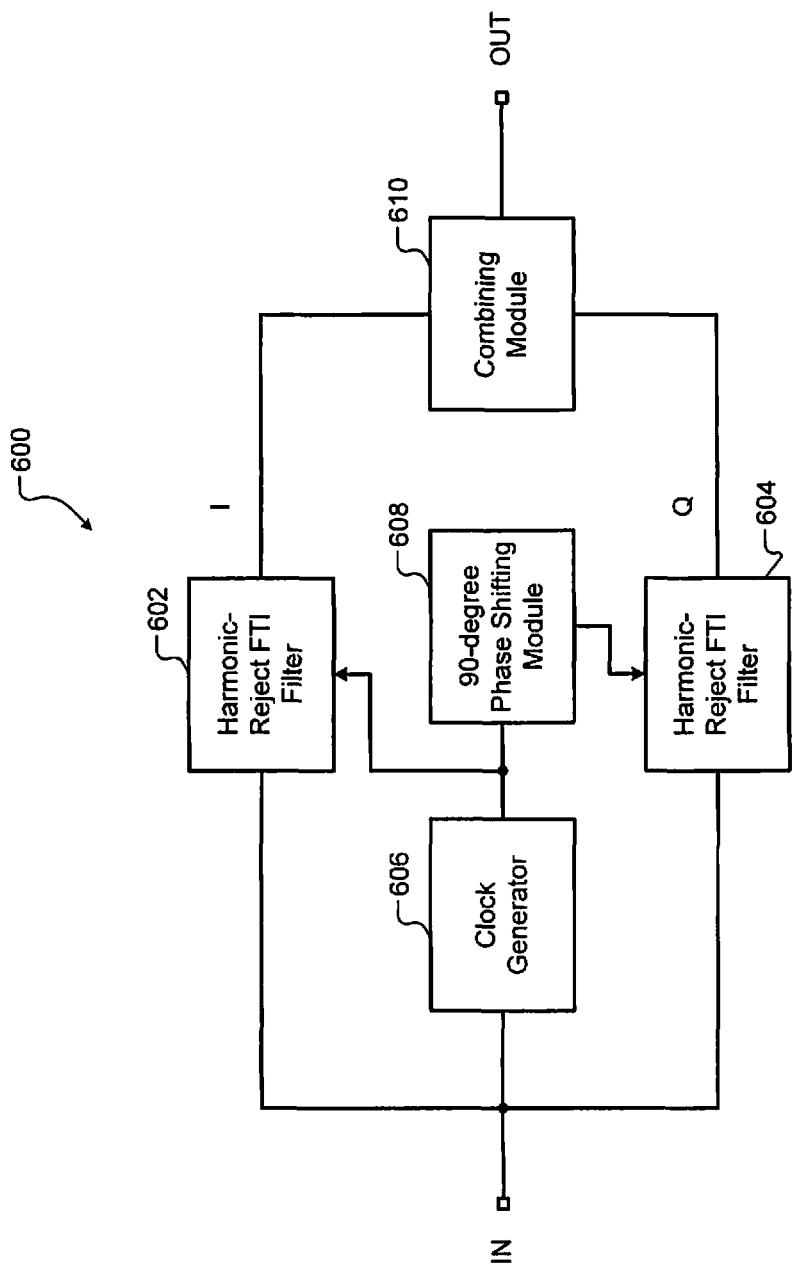
FIG. 20 is a functional block diagram of a quadrature harmonic reject FTI filter.

FIG. 20 show a quadrature harmonic reject FTI filter. FIGS. 21A-21D show a quadrature harmonic reject FTI filer that rejects $3^{rd}$ and $5^{th}$ harmonics, associated clock generator, and clock signals. FIGS. 22A-22C show a quadrature harmonic reject FTI filter that rejects $3^{rd}$, $5^{th}$, $7^{th}$, and $9^{th}$ harmonics and associated clock signals.

Referring now to FIGS. 8A and 8B, an FTI filter 300 and associated clock signals are shown. In FIG. 8A, the FTI filter 300 comprises an FSI stage, clocked switches (also called a mixer stage), and an input/output (I/O) stage. For example only, the FSI stage is shown to include an RC circuit that functions as a low-pass filter. Alternatively, any other type of filter circuit may be used. The clocked switches may include CMOS transistors, for example.

A clock generator 350 generates clock signals having a frequency $F_{LO}$ and a duty cycle of 25% as shown in FIG. 8B. The clock signals clock the switches of the mixer stage. The FTI filter 300 functions as a band-pass filter having a center frequency of $F_{LO}$. The center frequency of the FTI filter 300 can be set by selecting $F_{LO}$. The bandwidth of the FTI filter 300 can be set low by properly selecting the time constant of the RC filter circuit. Accordingly, the FTI filter 300 can have a high Q-factor and tunable center frequency.

In FIG. 8B, a local oscillator (LO) reference clock denotes a reference clock generated by a local oscillator (not shown) included in the clock generator 350. The clock signals include LO_IP, LO_IN, LO_QP, and LO_QN. The clock signals have a duty cycle of 25%. In the mixer stage, which is different than a downconversion mixer, the input signal is multiplied with the clock signal LO_I, which is given by LO_I=LO_IP−LO_IN. Additionally, the input signal is multiplied with the clock signal LO_Q, which is given by LO_Q=LO_QP−LO_QN. The clock signals LO_I and LO_Q are staircase type clock signals that include discrete steps (levels) in each clock period as shown.

In FIG. 8A, the differential input signal is FTI_P-FTI_N. In I channel, for example, the input signal is fed to the FSI stage (load) when switches driven by the LO_IP clock signal are ON (LO_IP=1). The input signal is inverted before reaching the FSI load when switches driven by the LO_IN clock signal are ON (LO_IN=1). As a result, the input signal is multiplied by a virtual function LO_I=LO_IP−LO_IN. Similar result obtains in the Q channel. Accordingly, the signal LO_I, which is composed of two signals LO_IP and LO_IN, and the signal LO_Q, which is composed of two signals LO_QP and LO_QN, are shown in FIG. 8B to illustrate harmonic content of the signals LO_I and LO_Q.

Referring now to FIGS. 9A and 9B, the clock signal LO_I is shown in time domain and frequency domain, respectively. If the frequency of the clock signal LO_I is $F_{LO}$, then a clock spectrum of the clock signal LO_I includes a main tone at frequency $F_{LO}$ and odd overtones (odd harmonics) at frequencies $(2N+1)F_{LO}$, where N is an integer greater than zero. In other words, the clock spectrum includes odd harmonics of the fundamental frequency $F_{LO}$ of the clock signal LO_I. These clock harmonics fold unwanted signals or noise over the wanted signal. Specifically, blockers and noise at the frequencies of the odd harmonics fold back into the desired signal at the fundamental frequency.

Referring now to FIG. 10, the effect of the folding back at the output of the FTI filter 300 is shown in frequency domain. FIG. 10 shows the tone level observed at the output of the FTI filter at the frequency $F_{LO}$ when sweeping in frequency the input tone. For input frequencies situated at odd overtones of $F_{LO}$, a part of the signal is folded and is found at the output at the frequency $F_{LO}$, with reduced amplitude. Aliasing is due to mixing of the input signal with the odd harmonics of the clock signal.

Referring now to FIGS. 11A and 11B, noise folding and blocker aliasing are shown in detail. In FIG. 11A, an example of noise folding is shown. An RF input signal of frequency $F_s$ and amplitude (magnitude) $S_i$ is input to the FTI filter 300. An input noise of amplitude (magnitude) $N_i$ may be present at the input of the FTI filter 300. The signal-to-noise ratio (SNR) at the input of the FTI filter 300 is $SNR_i$. The switches of the FTI filter 300 are clocked by clock signals of frequency $F_{LO}=F_s$.

When the RF input signal is filtered by the FTI filter 300, the noise at the frequencies of the odd harmonics of the clock signals folds back. Specifically, the noise present at (2N+1) $F_{LO}$ (the odd harmonics) is multiplied by the odd harmonics. The multiplied noise is summed at the output of the FTI filter 300. The summed noise is present in the output of the FTI filter 300 at the input signal frequency $F_s$ in particular (fundamental frequency of the clock signals). As a result, the noise $N_o$ at the output of the FTI filter 300 is greater in magnitude than $N_i$. Consequently, the SNR at the output of the FTI filter 300 ($SNR_o$) is less (degraded) than $SNR_i$. Thus, the noise at the odd harmonics of the clock signals folds back and decreases the SNR at the output of the FTI filter 300.

The noise shown in the example is white noise from a receive antenna and is of the same magnitude at the frequencies of all harmonics. Depending on the source and type of the noise, however, the magnitude of the noise, however, may vary with the frequencies of the harmonics. Accordingly, the degradation of the SNR at the output of the FTI filter 300 may also vary depending on the source and type of the noise.

In FIG. 11B, an example of blocker folding, or aliasing, is shown. For example, when listening to AM radio using an AM receiver, a wanted signal may have a frequency $F_s$=520 KHz. A blocker may be present at a frequency of an odd harmonic (e.g., at $3F_s$=1560 KHz). The wanted signal may be weak while the blocker may be strong as shown by the difference in their respective magnitudes. The strengths of the wanted signal and the blocker may differ due to the proximity of the receiver to the respective broadcasting stations.

When the wanted signal is filtered by the FTI filter 300 in the receiver, the blocker present at the odd harmonic $3F_{LO}$ folds back. Specifically, the blocker is multiplied by the odd harmonic $3F_{LO}$. The multiplied blocker is summed at the output of the FTI filter 300. The summed blocker is present in the output at the wanted signal frequency $F_s$ (fundamental frequency of the clock signals used to clock the switches of the FTI filter 300).

As a result, an in-band interference at the output of the FTI filter 300 is greater in magnitude than the in-band interference at the input of the FTI filter 300. Consequently, the signal-to-interference ratio (SIR) at the output of the FTI filter 300 ($SIR_o$) is degraded compared to the SIR at the input of the FTI filter 300 ($SIR_i$). Thus, the blockers at the odd harmonics of the clock signals fold back and decrease the SIR at the output of the FTI filter 300.

Assuming a broadband white noise, the SNR degradation due to noise folding is stronger for small order odd harmonics of the fundamental frequency of the clock signal. Similarly, assuming blockers of same amplitude at the input, the SIR degradation due to blockers folding is stronger for blockers situated at small order odd harmonics.

Rejection of the odd harmonics may limit their contribution to the SNR degradation. The rejection of the $3^{rd}$ and $5^{th}$ harmonics is initially discussed. Subsequently, the rejection of the $3^{rd}$, $5^{th}$, $7^{th}$, and $9^{th}$ harmonics is discussed.

Referring now to FIGS. 12A-12C, the $3^{rd}$ and $5^{th}$ harmonics can be rejected as follows. In FIG. 12A, three clock signals of frequency $F_{LO}$ are shown. The clock signals have phases of 0°, +45°, −45° and have weights (amplitudes) of 1, sqrt(2)/2, and sqrt(2)/2, respectively.

In FIG. 12B, a sum of vectors representing the three clock signals in a complex circle is shown. Let first, second, and third vectors denote the vectors of the clock signals having phases of 0°, +45°, and −45°, respectively, and a normalized length of 1, sqrt(2)/2, and sqrt(2)/2, respectively. The three vectors add at the fundamental frequency. Conversely, at the third and fifth harmonics of the fundamental frequency, the three vectors cancel each other since the phases of vectors two and three are +/−135° and +/−225°. This geometric representation of the cancelation of third and fifth harmonics can be demonstrated using Fourier series.

In FIG. 12C, the sum of the three clock signals is shown in the time domain. The clock signal resulting from the sum of the three clock signals is a staircase type clock signal having 6 steps discrete in time and amplitude. The clock signal shown in FIG. 12C can be generated from a reference clock (LO) running at $4F_{LO}$. The staircase type clock signals generated in this manner are free of $3^{rd}$ and $5^{th}$ harmonics. Accordingly, when these staircase type clock signals are used to clock switches in an appropriately modified FTI filter, the noise and/or blockers at the $3^{rd}$ and $5^{th}$ harmonics do not fold back and do not degrade the SNR at the output of the FTI filter.

Referring now to FIGS. 13A-13C, the principle described with reference to FIGS. 12A-12C can be used to generate staircase type clock signals that are free of the $3^{rd}$, $5^{th}$, $7^{th}$, and $9^{th}$ harmonics. In FIG. 13A, five clock signals of frequency $F_{LO}$ are shown. The clock signals have phases of 0°, +/−30°, and +/−60° and have weights (amplitudes) of 1, sqrt(3)/2, and ½ respectively, as shown. In FIG. 13B, five vectors representing the five clock signals are shown in a complex circle. As described with reference to FIG. 12B, these five vectors sum for the fundamental frequency, but cancel for the harmonics 3, 5, 7 and 9.

In FIG. 13C, the sum of the five clock signals is shown in time domain. The clock signal resulting from the sum of the five clock signals is a staircase type clock signal having 10 steps discrete in time and amplitude. The staircase type clock signal shown in FIG. 13C can be generated from a reference clock (LO) running at $6F_{LO}$. The staircase type clock signals generated in this manner are free of $3^{rd}$, $5^{th}$, $7^{th}$, and $9^{th}$ harmonics. Accordingly, when these staircase type clock signals are used to clock switches in an appropriately modified FTI filter, the noise and/or blockers at the $3^{rd}$, $5^{th}$, $7^{th}$, and $9^{th}$ harmonics do not fold back and do not degrade the SNR at the output of the FTI filter.

Referring now to FIGS. 14A-14F, the staircase type clock signal that includes partial or complete rejection of $3^{rd}$, $5^{th}$, $7^{th}$ and 9th harmonics are shown. In FIGS. 14A, 14C, and 14E, the staircase type clock signals are shown in time domain. In FIGS. 14B, 14D, and 14F, the staircase type clock signals and the first four odd harmonics are shown in the frequency domain. The magnitude of all the staircase type clock signals is normalized to 1.

In FIG. 14A, the staircase type clock signal that results when clock signals having two phases are used to clock switches of the mixer stage is shown. The clock signals having two phases are generated from a reference clock (LO) running at $2F_{LO}$. The resulting staircase type clock signal in the mixer stage has four steps in each clock period as shown. All of the odd harmonics are present in the clock spectrum as shown in FIG. 14B.

In FIG. 14C, the staircase type clock signal that results when clock signals having three phases are used to clock switches of the mixer stage is shown. The clock signals having three phases are generated from a reference clock (LO) running at $4F_{LO}$. The resulting staircase type clock in the mixer stage signal has six steps in each clock period as shown. The $3^{rd}$ and $5^{th}$ harmonics are absent in the clock spectrum as shown in FIG. 14D.

In FIG. 14E, the staircase type clock signal that results when clock signals having five phases are used to clock switches of the mixer stage is shown. The clock signals having five phases are generated from a reference clock (LO) running at $6F_{LO}$. The resulting staircase type clock in the mixer stage signal has ten steps in each clock period as shown. The $3^{rd}$, $5^{th}$, $7^{th}$, and $9^{th}$ harmonics are absent in the clock spectrum as shown in FIG. 14E.

In FIGS. 14D and 14F, the odd harmonics greater than the $9^{th}$ harmonic are not shown. These odd harmonics are still present in the clock spectrum. These harmonics can be rejected by extending the principle of rejecting harmonics described above.

Selection of harmonics for rejection depends on the application. For example, in an AM receiver, since the AM band is narrow, rejecting only the $3^{rd}$ and $5^{th}$ harmonics may be sufficient to improve the SNR. Noise (e.g., white noise), however, is generally present at frequencies of all harmonics. Accordingly, rejecting more harmonics may be desirable to improve the SNR.

Rejecting only the initial harmonics (e.g., $3^{rd}$, $5^{th}$, $7^{th}$, and $9^{th}$ harmonics) may, however, be effective and sufficient since the degradation of the SNR decreases as the frequency of the harmonics increases. Additionally, rejecting only the initial harmonics may be cost-effective since complexity of design and cost may increase when rejecting higher frequency harmonics.

Accordingly, rejection of only $3^{rd}$, $5^{th}$, $7^{th}$, and $9^{th}$ harmonics is discussed below. The $3^{rd}$, $5^{th}$, $7^{th}$, and $9^{th}$ harmonics, however, are used only as examples. The teachings of the present disclosure are not limited to rejecting only $3^{rd}$, $5^{th}$, $7^{th}$, and $9^{th}$ harmonics. The teachings can be extended to reject higher order harmonics.

Referring now to FIGS. 15A and 15B, a block diagram of a FTI filter and a timing diagram of the clock signal of the FTI filter are shown. In FIG. 15A, a FTI filer 400 comprises clocked switches (i.e., a mixer) 402, an FSI 404, and a clock generator 406. The FTI filter 400 has a single input/output terminal that communicates with the mixer 402. The clock generator 406 generates clock signals that clock the switches in the mixer 402.

In FIG. 15B, a timing diagram of a resulting clock signal LO is shown. The clock spectrum of the clock signal LO includes all of the odd harmonics of the clock signal LO. Accordingly, the SNR at the output of the FTI filter 400 is degraded by noise folding and/or blocker folding.

Referring now to FIGS. 16A-16C, a harmonic reject FTI filter and its clock signals according to the present disclosure are shown. In FIG. 16A, a block diagram of a harmonic reject FTI filter 450 is shown. In FIGS. 16B and 16C, timing diagrams of the clock signals of the harmonic reject FTI filter 450 are shown.

In FIG. 16A, the harmonic reject FTI filer 450 comprises clocked switches (i.e., a mixer) 452, the FSI 404, a clock generator 454, and a weighting and voltage-to-current (V-to-I) converting module 456. The harmonic reject FTI filter 450 has separate input and output terminals. The clock generator 454 generates clock signals that clock the switches in the mixer 452. The resulting clock signal LO may differ depending on whether $3^{rd}$ and $5^{th}$ harmonics are being rejected or whether $3^{rd}$, $5^{th}$, $7^{th}$, and $9^{th}$ harmonics are being rejected.

In FIG. 16B, a timing diagram of the clock signal LO when $3^{rd}$ and $5^{th}$ harmonics are rejected is shown. In FIG. 16C, a timing diagram of the clock signal LO when $3^{rd}$, $5^{th}$, $7^{th}$, and $9^{th}$ harmonics are rejected is shown. The degradation of the SNR at the output of the FTI filter 450 is decreased depending on whether $3^{rd}$ and $5^{th}$ harmonics are being rejected or whether $3^{rd}$, $5^{th}$, $7^{th}$, and $9^{th}$ harmonics are being rejected.

In FIG. 16A, the weighting and V-to-I converting (weighting and converting) module 456 receives the input signal to the harmonic reject FTI filter 450. The weighting and converting module 456 converts the input voltage of the input signal into a plurality of currents each having a different weight. The currents are summed in the mixer 452, and an output of the harmonic reject FTI filter 450 is generated.

The V-to-I conversion and weighting may be implemented in many ways. For example only, the V-to-I conversion and weighting may be implemented using a resistive network or transconductance ($g_m$) amplifiers. Alternatively, any other suitable scheme may be used.

The input signal to the harmonic reject FTI filter 450 is separated or split into a plurality of parallel paths. The signal in each path is weighted differently. The weighted signals in the paths are input in parallel to the mixer stage. The weighted signals are multiplied in the mixer stage. The multiplied signals are then combined (summed) and output at the output of the harmonic reject FTI filter 450.

Referring now to FIGS. 17A and 17B, for example only, the weighting and converting module 456 may comprise a resistive network 456-1 or transconductance amplifiers 456-2, respectively. In FIG. 17A, for example only, the resistive network 456-1 includes resistors R1 and R2. Although only two resistors are shown, any number of resistors may be used instead. The input to the harmonic reject FTI filter 450 is fed to the resistors R1 and R2. The resistors R1 and R2 convert the input voltage of the input signal into currents i1 and i2. Values of the currents i1 and i2 depend on values of the resistors R1 and R2. In general, the ratio between currents i1 and i2 may be given by the equation i1/i2=R2/R1.

In FIG. 17B, for example only, the transconductance amplifiers 456-2 include transconductance amplifiers $g_{m1}$ and $g_{m2}$. Although only two transconductance amplifiers are shown, any number of transconductance amplifiers may be used instead. The input to the harmonic reject FTI filter 450 is fed to the transconductance amplifiers $g_{m1}$ and $g_{m2}$. The transconductance amplifiers $g_{m1}$ and $g_{m2}$ convert the input voltage of the input signal into currents i1 and i2. Values of the currents i1 and i2 depend on values of transconductances of $g_{m1}$ and $g_{m2}$ of the transconductance amplifiers $g_{m1}$ and $g_{m2}$, respectively. In general, the ratio between currents i1 and i2 may be given by the equation i1/i2=$g_{m1}/g_{m2}$.

The harmonic reject FTI filter 450 differs from the FTI filter 400 in many respects. Following are some of the differences. As shown in FIGS. 15B, 16B, and 16C, the clock signals LO of the FTI filter 450 include more time steps per cycle than the clock signals LO of the FTI filter 400. Further, the weighting and converting module 456 determines the amplitude of each time step prior to mixing. For example only, the amplitude of each time step is determined by the values of the resistors or the transconductances.

Referring now to FIGS. 18A-18C, a 3/5 harmonic reject FTI filter 500 that rejects $3^{rd}$ and $5^{th}$ harmonics and a timing diagram of its clock signals are shown. In FIG. 18A, the 3/5 harmonic reject FTI filter 500 comprises a weighting stage 502, a mixer stage 504, the FSI 404, and a clock generator 508. The mixer stage 504 comprises a first mixer (first clocked switches) 504-1 and a second mixer (second clocked switches) 504-2.

In FIG. 18B, for example only, the weighting stage 502 has two parallel paths. A first path is weighted with a weight of 1 (unity). The input signal is supplied as is (unchanged) via the first path to the first mixer 504-1. A second path is weighted with a weight of sqrt(2). The input signal is weighted with a weight of sqrt(2) and supplied via the second path to the second mixer 504-2. In some implementations, the paths may be weighted using relative weights rather than absolute weights. For example, the first signal can be weighted or converted (V-to-I) with a weight of A while the second path is weighted with a weight of (A*sgrt(2)), and so on.

In FIG. 18C, the clock generator 508 generates clock signals LO1 and LO2 as shown. The first and second clocked switches 504-1, 504-2 are clocked by clock signals LO1 and LO2, respectively. The 3/5 harmonic reject FTI filter 500 rejects $3^{rd}$ and $5^{th}$ harmonics.

Referring now to FIGS. 19A-19C, a 3/5/7/9 harmonic reject FTI filter 500 that rejects $3^{rd}$, $5^{th}$, $7^{th}$, and $9^{th}$ harmonics and a timing diagram of its clock signals are shown. In FIG. 19A, the 3/5/7/9 harmonic reject FTI filter 550 comprises a weighting stage 552, a mixer stage 554, the FSI 404, and a clock generator 558. The mixer stage 554 comprises a first mixer (first clocked switches) 554-1, a second mixer (second clocked switches) 554-2, and a third mixer (third clocked switches) 554-3.

In FIG. 19B, for example only, the weighting stage 552 has three parallel paths. A first path is weighted with a weight of 1 (unity). The input signal is supplied as is (unchanged) via the first path to the first mixer 554-1. A second path is weighted with a weight of sqrt(3). The input signal is weighted with a weight of sqrt(3) and supplied via the second path to the second mixer 554-2. A third path is weighted with a weight of 1 (unity). The input signal is supplied as is (unchanged) via the third path to the third mixer 554-3. Alternatively, the paths may be weighted using relative weights rather than absolute weights.

In FIG. 19C, the clock generator 558 generates clock signals LO1, LO2, and LO3 as shown. The first, second, and third clock switches 554-1, 554-2, 554-3 are clocked by clock signals LO1, LO2, and LO3, respectively. The 3/5/7/9 harmonic reject FTI filter 550 rejects $3^{rd}$, $5^{th}$, $7^{th}$, and $9^{th}$ harmonics.

In the implementations shown in FIGS. 18A-19C, the input signal is multiplied in the mixer stages by a cosine of a phase difference between the input signal and the clock signals. When the input signal and the clock signals are in phase, the phase difference is zero. Since cosine of zero is 1, the output of the FTI filter is of full amplitude.

Occasionally, however, the input signal may be in quadrature with the clock signals. That is, the phase difference between the input signal and the clock signals may be 90°. When the input signal and the clock signals are in quadrature, the output of the FTI filter may be zero since cosine of 90° is zero. Accordingly, a harmonic reject FTI filter having a quadrature configuration may be used instead.

Referring now to FIG. 20, a harmonic reject FTI filter 600 having a quadrature configuration is shown. The harmonic reject FTI filter 600 comprises a first harmonic reject FTI filter 602 in an in-phase (I) channel and a second harmonic reject FTI filter 604 in a quadrature (Q) channel. Additionally, the harmonic reject FTI filter 600 comprises a clock generator 606, a 90° phase shifter 608, and a combining module 610.

The clock generator 606 generates clock signals to clock the switches in the first and second harmonic reject FTI filters 602, 604. The clock signals are generated to reject the odd harmonics according to the teachings of the present disclosure. The 90° phase shifter 608 shifts the phase of the clock signals by 90°. The clock signals without the 90° phase shift are supplied to the first harmonic reject FTI filter 602. The clock signals with the 90° phase shift are supplied to the second harmonic reject FTI filter 604.

When the input signal is in phase with the clock signals, the first harmonic reject FTI filter 602 supplied with the clock signals without the 90° phase shift generates an output. When the input signal is in quadrature with the clock signals, the second harmonic reject FTI filter 604 supplied with the clock signals having the 90° phase shift generates an output. For other phase differences between the input and clock signals, both FTI filters 602 and 604 will contribute to generate the output. The combining module 610 combines the outputs of the first and second harmonic reject FTI filters 602, 604 to generate an output of the harmonic reject FTI filter 600.

Figure 21A:
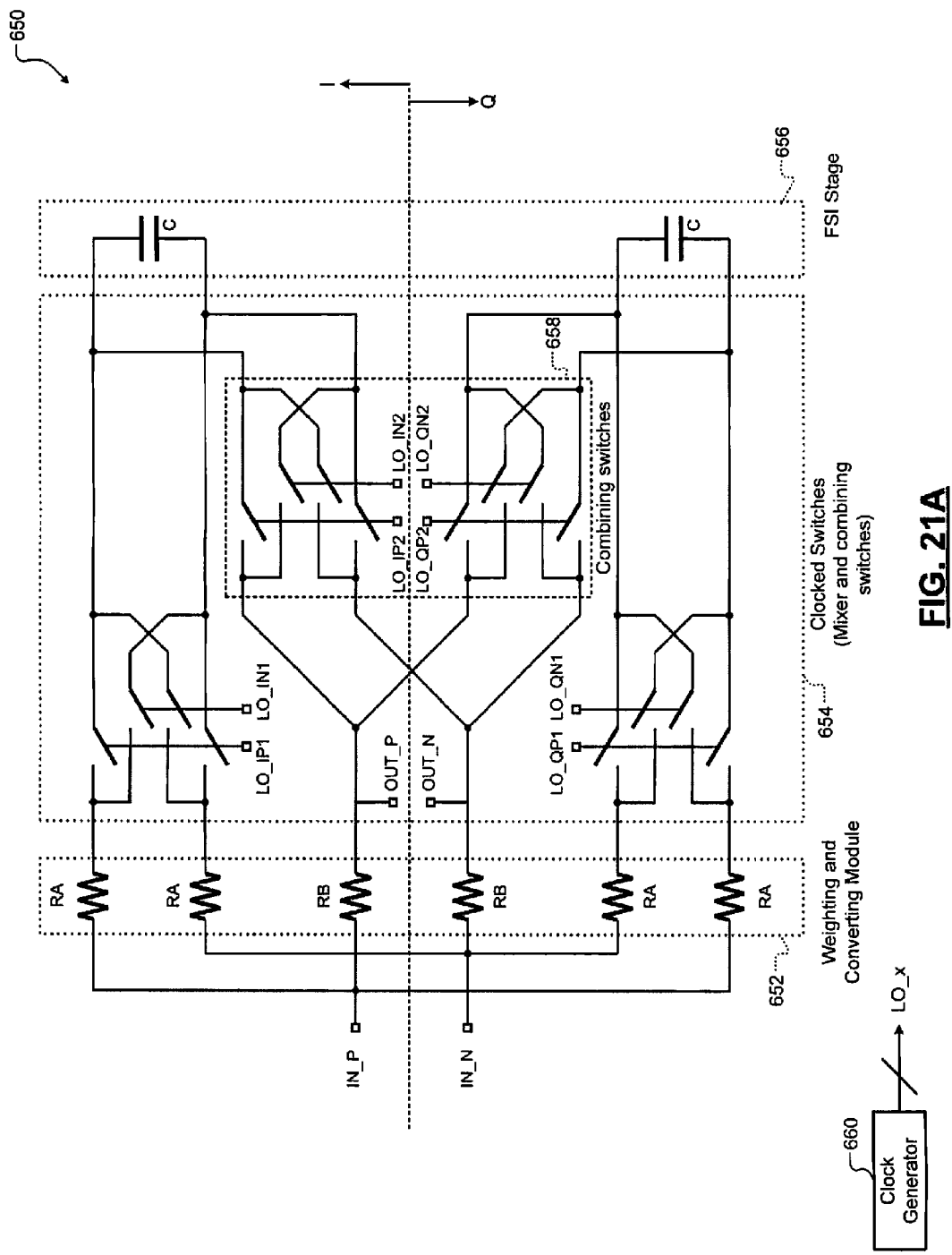

Referring now to FIGS. 21A-21D, an implementation of a 3/5 harmonic reject FTI filter 650 having a quadrature configuration and timing diagrams of its clock signals are shown. In FIG. 21A, the 3/5 harmonic reject FTI filter 650 comprises I and Q channels as shown. The input and output signals of the FTI filter 650 do not comprise I and Q channels. The I and Q channels are internal to the FTI filter 650.

The 3/5 harmonic reject FTI filter 650 comprises a weighting and converting module 652, mixer and combining switches 654, an FSI stage 656, and a clock generator 660. The mixer and combining switches 658 have two functions: they serve as mixing switches of the second path of the weighting and converting module 652 and as recombining switches. The clock generator 660 generates the clock signals according to the teachings of the present disclosure.

The weighting and converting module 652 is shown to include resistors for example only. Instead, transconductance amplifiers or any other suitable circuit elements may be used. The FSI stage 656 is shown to include capacitors for example only. Instead, filters comprising any other suitable circuit elements may be used. For example, any combination of passive circuit elements such as R, L, C, and/or active circuit elements may be used.

In FIG. 21A, the input signal is weighted using the resistors $R_A$ and $R_B$. The weighting of the input signal is determined by the ratio of the resistors $R_A$ and $R_B$. To reject $3^{rd}$ and $5^{th}$ harmonics, the ratio of the resistors is set using the equation $R_A = \alpha * R_B$, where $\alpha$=sqrt(2). The weighting of the input signal, as determined by the ratio of the resistors $R_A$ and $R_B$, in turn determines the amplitudes of the time steps of the staircase type clock signals as shown in FIG. 21B. The value of a can be within a narrow range of sqrt(2). For example, in some implementations, the values of α may be 1.4 or 1.5 instead of sqrt(2).

The FSI stage 656 filters the input signal. The combining switches 658 communicate with the FSI stage 656. The combining switches 658 are clocked by the clock signals generated by the clock generator 660. The combining switches 658 combine the I and Q components of the output to generate the output of the 3/5 harmonic reject FTI filter 650.

Figure 21C:
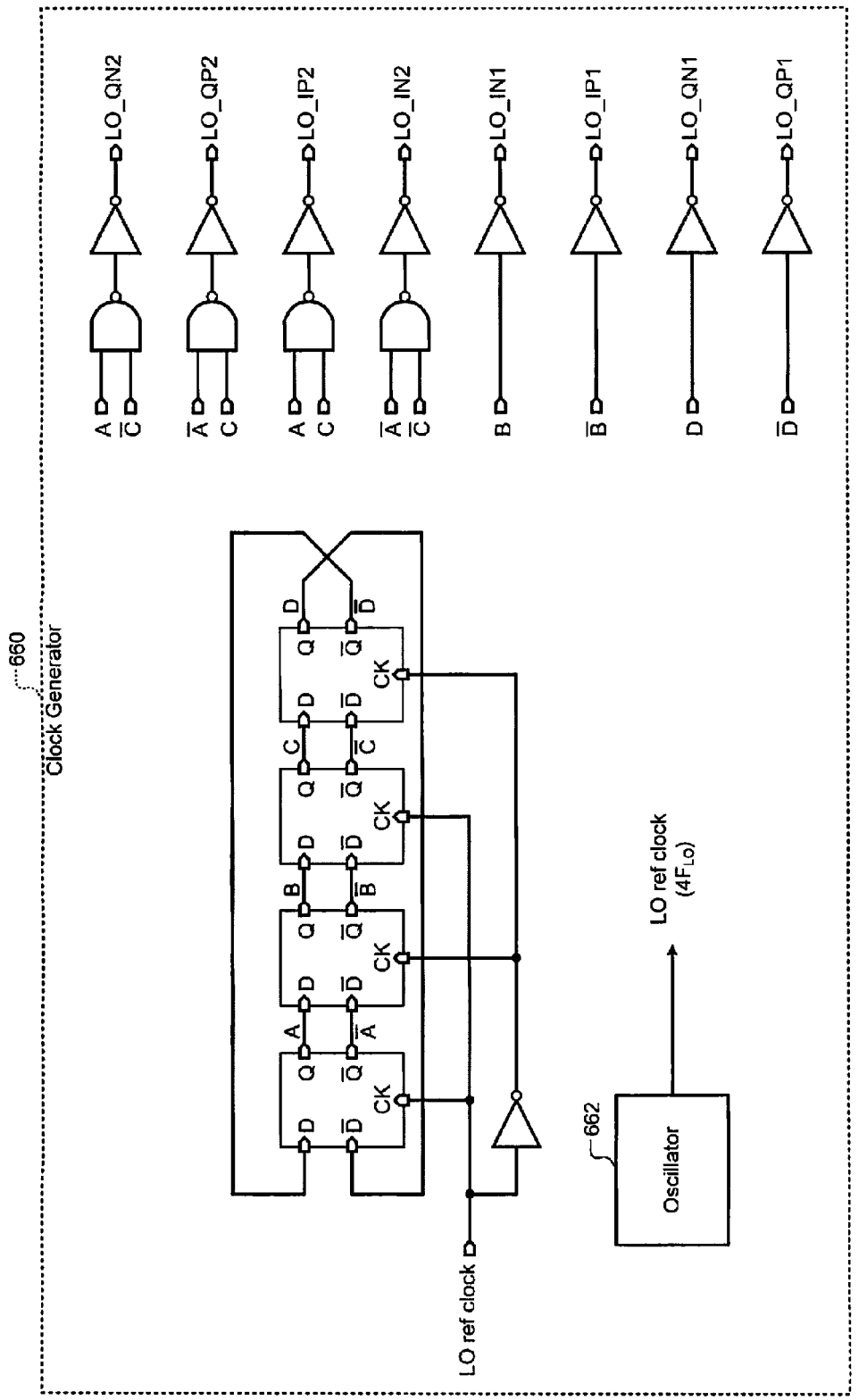
Figure 22A:
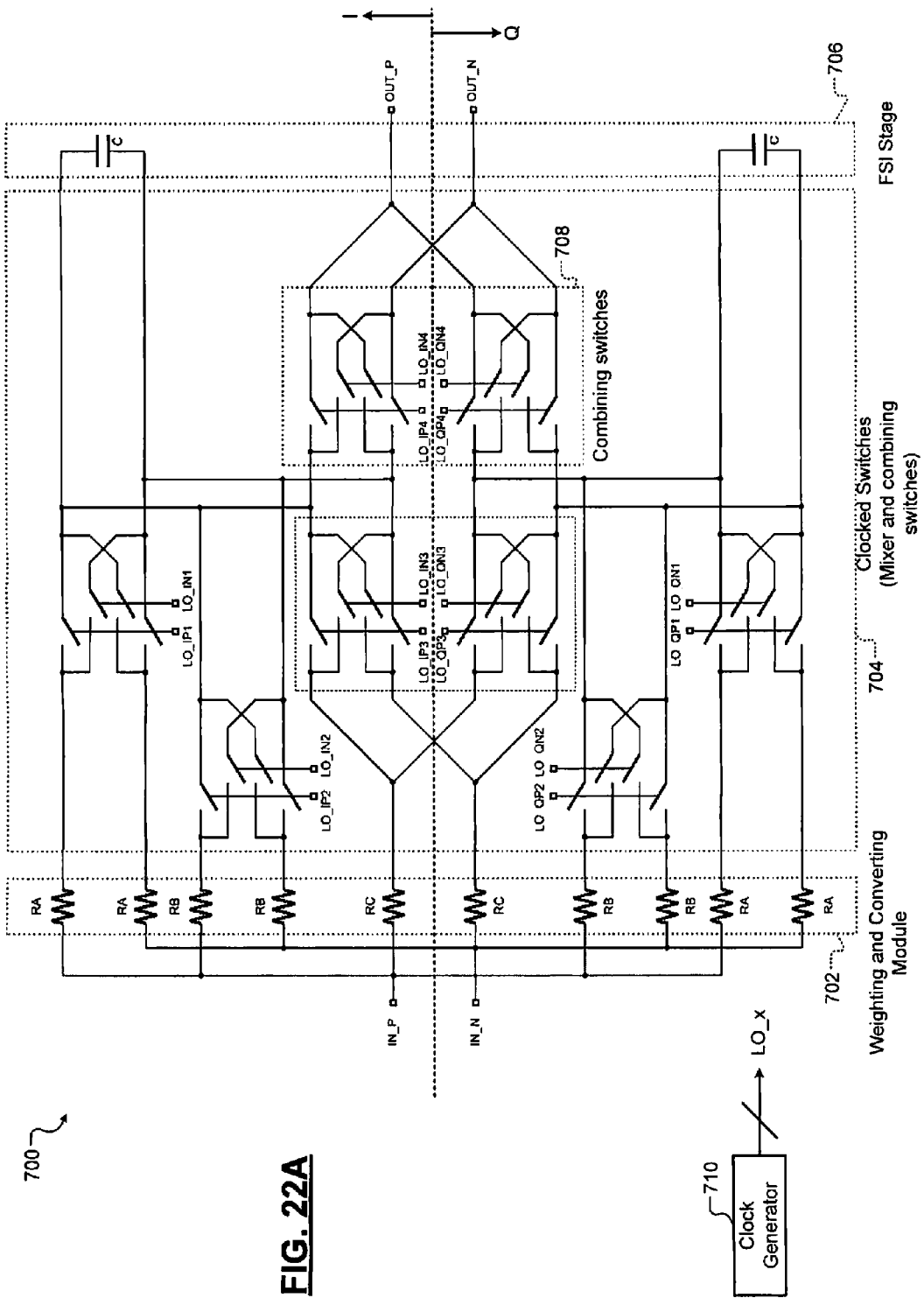
FIGS. 22A-22C depict a schematic of a quadrature harmonic reject FTI filer that rejects $3^{rd}$, $5^{th}$, $7^{th}$, and $9^{th}$ harmonics and associated clock signals.
Figure 22B:
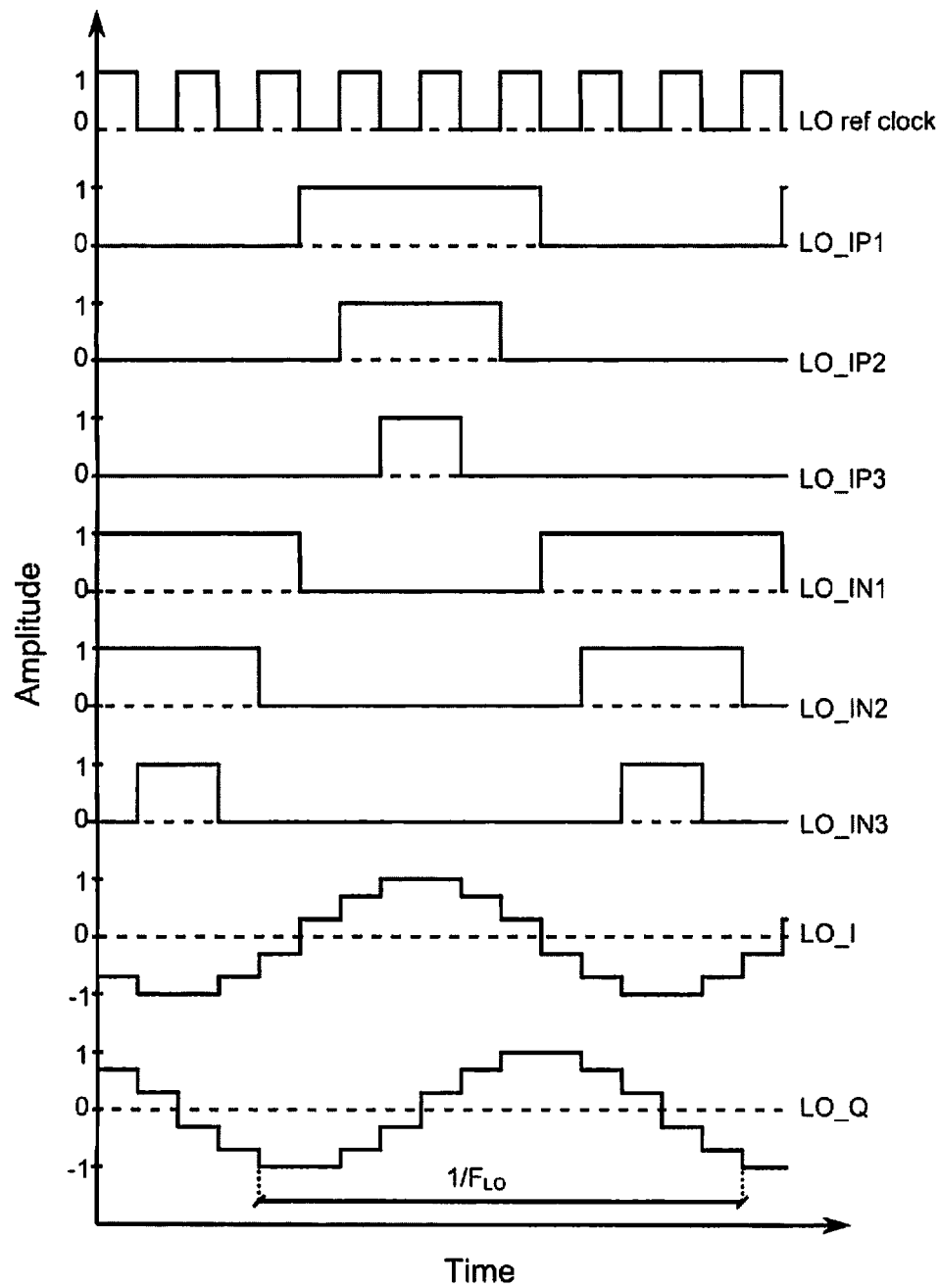
Figure 22C:
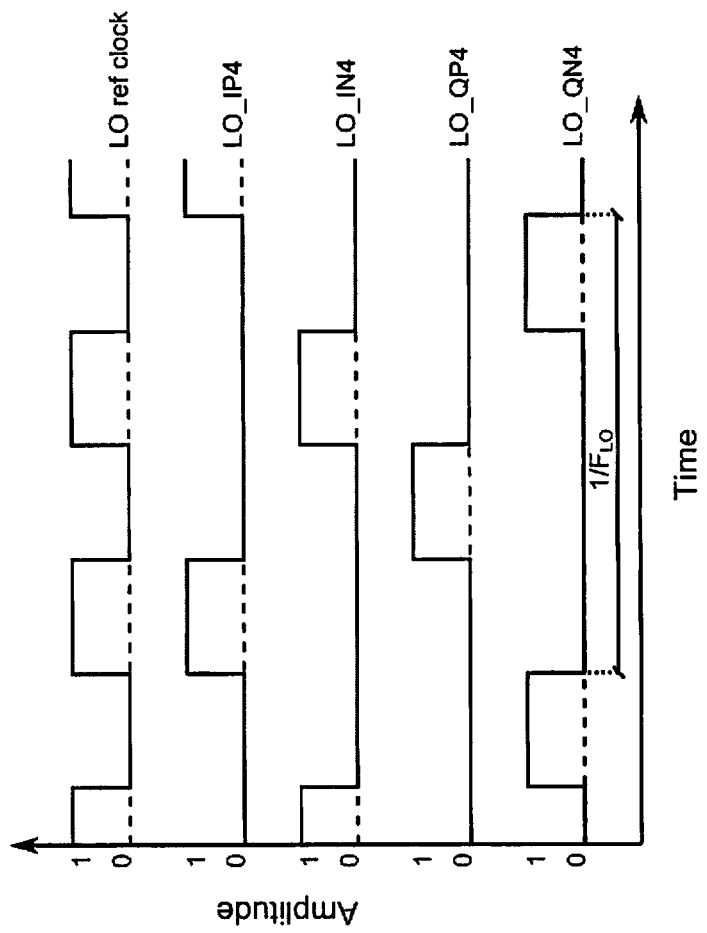

In FIG. 21C, an implementation of the clock generator 660 is shown. For example only, the clock generator 660 may comprise an oscillator 662 that generates a reference clock running at a frequency $4F_{LO}$, where $F_s = F_{LO}$ is the frequency of the input signal. The clock generator 660 may comprise circuit elements including sequential logic (e.g., flip-flops, counters, etc.) and combinational logic (e.g., logic gates). The clock generator 660 generates the clock signals that clock the mixer and combining switches 654.

For example only, the clock generator 660 is shown to include a cascade of four symmetrical D-type latches. The cascade divides the frequency of the reference clock by 4. Additionally, the cascade generates 8 outputs having 8 phases, respectively. The 8 phases are shifted by 45° from each other. From the 8 outputs, a combination of logic gates shown generates 8 clock signals for the 3/5 harmonic reject FTI filter 650.

Figure 21D:
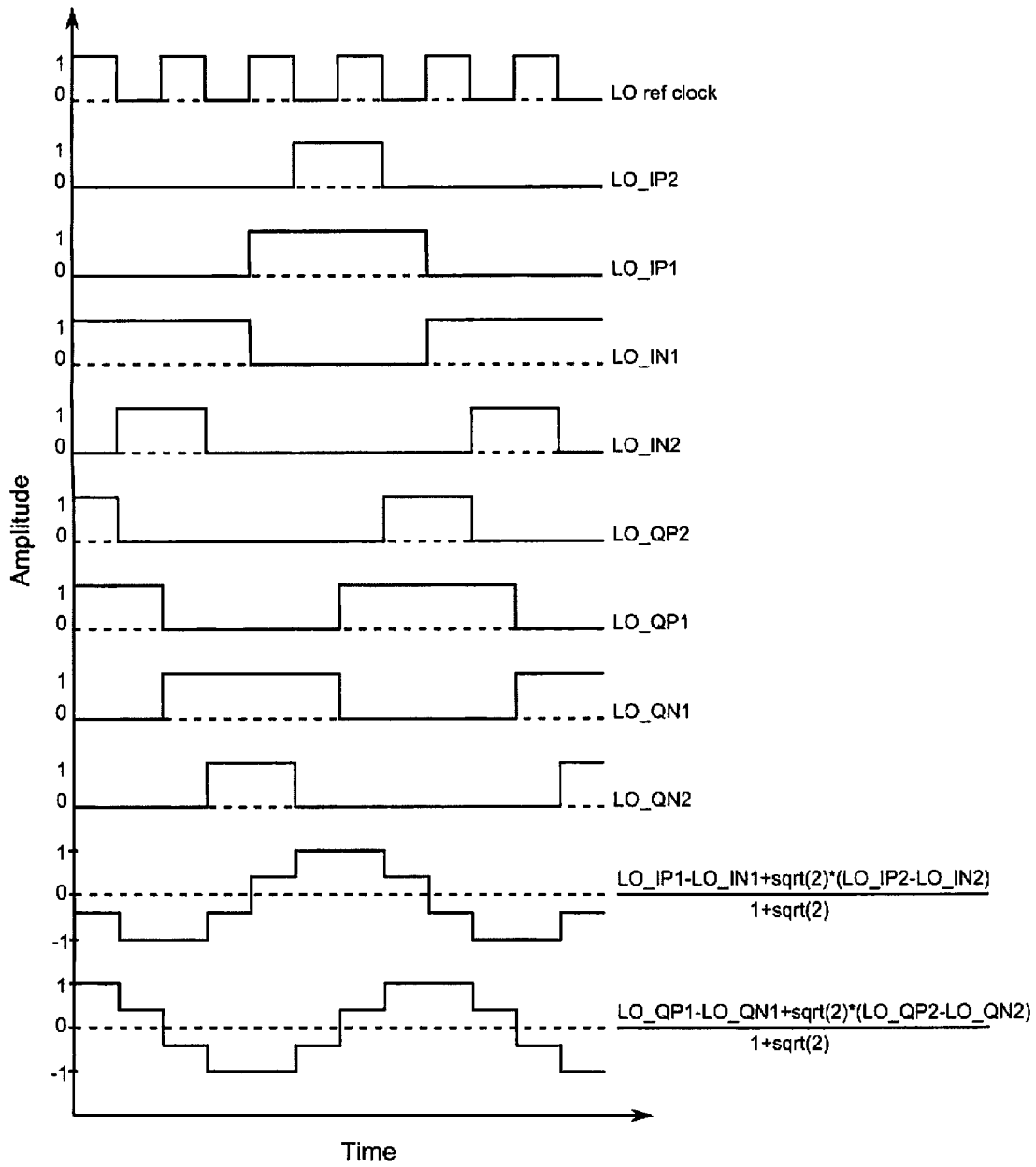

In FIG. 21D, the 8 clock signals generated by the clock generator 660 are shown. The I channel of the 3/5 harmonic reject FTI filter 650 uses four clock signals: LO_IP1, LO_IP2, LO_IN1, and LO_IN2. The Q channel of the 3/5 harmonic reject FTI filter 650 uses four clock signals: LO_QP1, LO_QP2, LO_QN1, and LO_QN2. The clock signals LO_QP1, LO_QP2, LO_QN1, and LO_QN2 are in quadrature (i.e., 90° phase shifted) relative to the clock signals LO_IP1, LO_IP2, LO_IN1, and LO_IN2, respectively. These eight clock signals are generated from a single reference clock running at $4F_{LO}$, where $F_s = F_{LO}$ is the frequency of the input signal.

Referring now to FIGS. 22A-22C, an implementation of a 3/5/7/9 harmonic reject FTI filter 700 having a quadrature configuration and timing diagrams of its clock signals are shown. In FIG. 22A, the 3/5/7/9 harmonic reject FTI filter 700 comprises I and Q channels as shown.

The 3/5/7/9 harmonic reject FTI filter 700 comprises a weighting and converting module 702, mixer and combining switches 704, an FSI stage 706, and a clock generator 710. The mixer and combining switches 704 include combining switches 708 in addition to mixer switches. The clock generator 710 generates the clock signals according to the teachings of the present disclosure.

The weighting and converting module 702 is shown to include resistors for example only. Instead, transconductance amplifiers or any other suitable circuit elements may be used for weighting and converting the input signal. The FSI stage 706 is shown to include capacitors for example only. Instead, filters comprising any other suitable circuit elements may be used. For example, any combination of passive circuit elements such as R, L, C, and/or active circuit elements may be used.

In FIG. 22A, the input signal is weighted using the resistors $R_A$, $R_B$, and $R_C$. The weighting of the input signal is determined by the ratio of the resistors $R_A$ and $R_C$ relative to $R_B$. To reject $3^{rd}$, $5^{th}$, $7^{th}$ and $9^{th}$ harmonics, the ratio of the resistors is set using the equation $R_A = R_C = \alpha * R_B$, where $\alpha = \mathrm{sqrt}(3)$. The weighting of the input signal, as determined by the ratio of the resistors, in turn determines the amplitudes of the time steps of the staircase type clock signals. The value of $\alpha$ can be within a narrow range of sqrt(3). For example, in some implementations, the values of $\alpha$ may be 1.7 or 1.8 instead of sqrt(3).

The FSI stage 706 filters the input signal. The combining switches 708 communicate with the FSI stage 706. The combining switches 708 are clocked by the clock signals generated by the clock generator 710. The combining switches 708 combine the I and Q components of the output to generate the output of the 3/5/7/9 harmonic reject FTI filter 700.

The clock generator 710 may comprise an oscillator (not shown) that generates reference clocks running at frequencies $2F_{LO}$ and $6F_{LO}$, where $F_s = F_{LO}$ is the frequency of the input signal. The clock generator 710 may comprise circuit elements including sequential logic (e.g., flip-flops, counters, etc.) and combinational logic (e.g., logic gates). The clock generator 710 generates the clock signals that clock the mixer and combining switches 704.

In FIG. 22B, the 3/5/7/9 harmonic reject FTI filter 700 uses a total of 16 clock signals. Twelve of the clock signals include LO_IP1, LO_IP2, LO_IP3, LO_IN1, LO_IN2, LO_IN3 and their quadrature counterparts. The quadrature counterparts include LO_QP1, LO_QP2, LO_QP3, LO_QN1, LO_QN2, and LO_QN3. The clock generator 710 generates these 12 clock signals using a reference clock running at $6F_{LO}$.

In FIG. 22C, the other 4 clock signals include LO_IP4, LO_IN4, LO_QP4, and LO_QN4. The clock generator 710 generates these 4 clock signals using a reference clock running at $2F_{LO}$. Alternatively, the clock generator 710 may generate all of the 16 clock signals using a single reference clock running at $12F_{LO}$.

In summary, the present disclosure teaches low-voltage, low-power, passive FTI implementations. Predetermined clock harmonics are rejected based on the ratio of elements used in the weighting stage that precedes the FTI filters. The harmonic rejection reduces SNR degradation at the output of the FTI filters. Different harmonics can be rejected using different weights and different clock signals.

The present disclosure primarily describes differential and quadrature implementations. The teachings of the present disclosure, however, are not limited to differential or quadrature implementations. The teachings of the present disclosure can also be applied to single-ended implementations and/or implementations not using quadrature techniques.

Further, other implementations of weighting and V-to-I conversion different than those described herein are contemplated. Other types of filters (e.g., filters comprising passive R, L, C networks and/or active filters) may be used to implement the FSI stages. Additionally, a plurality of FTI filters may be arranged in parallel and/or in other configurations to achieve greater rejection of harmonics, noise, and blockers. In some implementations, combinations of weights and clock signals different than those described herein may be used to reject harmonics.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system comprising:
a weighting module configured to
receive an input signal having an amplitude, and
generate weighted outputs,
wherein amplitudes of the weighted outputs have ratios relative to the amplitude of the input signal;
a mixer module including switches,
wherein each of the switches includes a first terminal, a second terminal, and a control terminal, and
wherein the mixer module is configured to
receive the weighted outputs via the first terminals of the switches, and
generate a staircase waveform in response to receiving clock signals at the control terminals of the switches,
wherein amplitudes of steps of the staircase waveform are based on the ratios; and
a frequency selective impedance circuit connected across the second terminals of the switches,
wherein the switches are configured to translate an impedance of the frequency selective impedance circuit centered on a first frequency to a second frequency determined by a frequency of the clock signals.

2. The system of claim 1, wherein a number of steps per cycle of the staircase waveform is based on a number of harmonics of the clock signals to be rejected from an output of the mixer module.

3. The system of claim 1, wherein the switches are configured to further mix the weighted outputs based on the staircase waveform to generate a filtered signal, wherein a number of harmonics of the clock signals are removed from the filtered signal.

4. The system of claim 1, wherein the frequency selective impedance circuit includes a filter circuit comprising at least one of a passive circuit element and an active circuit element.

5. The system of claim 1, further comprising a combining module configured to combine outputs of the switches and to generate a filtered signal, wherein a number of harmonics of the clock signals are removed from the filtered signal.

6. The system of claim 1, further comprising a clock generator configured to generate the clock signals, wherein a frequency of the clock signals is equal to a frequency of the input signal.

7. The system of claim 6, wherein the clock generator is configured to generate the clock signals based on a reference clock having N times the frequency of the input signal, where N is an integer greater than 1, and where a value of N is based on a number of harmonics of the clock signals to be rejected from an output of the mixer module.

8. The system of claim 1, wherein the weighting module comprises a plurality of voltage-to-current converters, wherein each of the voltage-to-current converters is configured to receive the input signal and to generate one of the weighted outputs.

9. The system of claim 8, wherein the voltage-to-current converters include one of resistances and transconductances, and wherein values of the one of the resistances and transconductances are based on the ratios.

10. A system comprising:
a weighting module configured to
receive an input signal having an amplitude, and
generate weighted outputs,
wherein amplitudes of the weighted outputs have ratios relative to the amplitude of the input signal;
a first mixer module including first switches,
wherein each of the first switches include a first terminal, a second terminal, and a control terminal, and
wherein the first mixer module is configured to
receive the weighted outputs via the first terminals of the first switches, and
generate a first staircase waveform in response to receiving first clock signals at the control terminals of the first switches;
a second mixer module including second switches,
wherein each of the second switches includes a first terminal, a second terminal, and a control terminal, and
wherein the second mixer module is configured to
receive the weighted outputs via the first terminals of the second switches, and
generate a second staircase waveform in response to receiving second clock signals at the control terminals of the second switches;
a first frequency selective impedance circuit connected across the second terminals of the first switches; and
a second frequency selective impedance circuit connected across the second terminals of the second switches,
wherein the first switches are configured to translate an impedance of the first frequency selective impedance circuit centered on a first frequency to a second frequency determined by a frequency of each of the first clock signals and the second clock signals, and
wherein the second switches are configured to translate an impedance of the second frequency selective impedance circuit centered on the first frequency to the second frequency.

11. The system of claim 10, wherein a number of steps per cycle of each of the first staircase waveform and the second staircase waveform is based on a number of harmonics of each of the first clock signals and the second clock signals to be rejected from a combined output of the mixer module.

12. The system of claim 10, wherein:
the first switches and the second switches are configured to further mix the weighted outputs based on the first staircase waveform and the second staircase waveform to generate a first output and a second output, respectively; and
a number of harmonics of each of the first clock signals and the second clock signals is removed from a combination of the first output and the second output.

13. The system of claim 10, wherein each of the first frequency selective impedance circuit and the second frequency selective impedance circuit includes a filter circuit comprising at least one of a passive circuit element and an active circuit element.

14. The system of claim 10, further comprising a combining module configured to:
combine outputs of the first switches and the second switches; and
generate a filtered signal, wherein a number of harmonics of each of the first clock signals and the second clock signals is removed from the filtered signal.

15. The system of claim 10, further comprising a clock generator configured to generate the first clock signals and the second clock signals, wherein a frequency of each of the first clock signals and the second clock signals is equal to a frequency of the input signal, and wherein the first clock signals and the second clock signals are in quadrature.

16. The system of claim 15, wherein the clock generator is configured to generate the first clock signals and the second clock signals based on a reference clock having N times the frequency of the input signal, where N is an integer greater than 1, and where a value of N is based on a number of harmonics of each of the first clock signals and the second clock signals to be rejected from an output of the mixer module.

17. The system of claim 10, wherein the weighting module comprises a plurality of voltage-to-current converters, wherein the voltage-to-current converters include one of resistances and transconductances, and wherein values of the one of the resistances and transconductances are based on the ratios.

18. A method comprising:
receiving an input signal having an amplitude;
generating weighted outputs based on the input signal, wherein amplitudes of the weighted outputs have ratios relative to the amplitude of the input signal;
generating, using switches having first terminals, second terminals, and control terminals, a staircase waveform based on the weighted outputs received via the first terminals of the switches in response to receiving clock signals at the control terminals of the switches, wherein amplitudes of steps of the staircase waveform are based on the ratios; and
translating an impedance of a frequency selective impedance circuit centered on a first frequency to a second frequency determined by a frequency of the clock signals,
wherein the frequency selective impedance circuit is connected across the second terminals of the switches,
wherein the frequency selective impedance circuit includes a filter circuit, and wherein a number of steps per cycle of the staircase waveform is based on a number of harmonics of the clock signals to be rejected from an output of the switches.

19. The method of claim 18, further comprising:
mixing the weighted outputs based on the staircase waveform to generate a filtered signal; and
removing a number of harmonics of the clock signals from the filtered signal.

20. The method of claim 18, further comprising generating the clock signals, wherein a frequency of the clock signals is equal to a frequency of the input signal.

* * * * *